United States Patent
Yoshikawa

(10) Patent No.: US 6,711,724 B2
(45) Date of Patent: Mar. 23, 2004

(54) SEMICONDUCTOR INTEGRATED CIRCUIT DEVICE HAVING PIPELINE STAGE AND DESIGNING METHOD THEREFOR

(75) Inventor: Atsushi Yoshikawa, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 36 days.

(21) Appl. No.: 10/319,658

(22) Filed: Dec. 16, 2002

(65) Prior Publication Data

US 2003/0149943 A1 Aug. 7, 2003

(30) Foreign Application Priority Data

Feb. 7, 2002 (JP) ........................ 2002-030246

(51) Int. Cl.⁷ .................................. G06F 9/45
(52) U.S. Cl. ............................ 716/6; 712/10
(58) Field of Search ................... 716/1, 2, 6; 712/10, 712/11, 15

(56) References Cited

U.S. PATENT DOCUMENTS

| | | | | |
|---|---|---|---|---|
| 6,081,656 A | * | 6/2000 | Witt | 716/3 |
| 6,101,621 A | * | 8/2000 | Kondo | 714/724 |
| 6,216,256 B1 | * | 4/2001 | Inoue et al. | 716/6 |
| 6,336,205 B1 | * | 1/2002 | Kurokawa et al. | 716/2 |
| 6,378,123 B1 | * | 4/2002 | Dupenloup | 716/18 |
| 6,457,161 B1 | * | 9/2002 | Nadeau-Dostie et al. | 716/6 |
| 6,466,066 B1 | * | 10/2002 | Yoshikawa | 327/141 |
| 6,564,360 B2 | * | 5/2003 | Chiu | 716/6 |
| 6,594,805 B1 | * | 7/2003 | Tetelbaum et al. | 716/5 |
| 2001/0013101 A1 | * | 8/2001 | Yoshikawa et al. | 713/500 |

FOREIGN PATENT DOCUMENTS

| | | | | |
|---|---|---|---|---|
| JP | 2001-156598 | | 6/2001 | |
| JP | 2001217694 A | * | 8/2001 | H03K/05/135 |

* cited by examiner

Primary Examiner—Stacy A Whitmore
(74) Attorney, Agent, or Firm—Burns, Doane, Swecker & Mathis, LLP

(57) ABSTRACT

Logic circuits are arranged to constitute a pipeline with a clock signal cycle period set longer than a target cycle period by a gain obtained when replacing a flip-flop circuit by latch circuits. Then, the clock signal cycle period is changed to the target cycle period, to detect a critical path, on which a setup condition error occurs in the pipeline. After replacing the flip-flop circuit related to this error path by complementarily operating latch circuits, related logic circuits are rearranged according to the replacing latch circuits, to meet various operating parameters. In this way, it becomes possible to readily design a pipeline that accurately operates synchronously with a high-speed clock signal.

11 Claims, 9 Drawing Sheets

SEMICONDUCTOR INTEGRATED CIRCUIT DEVICE HAVING PIPELINE STAGE AND DESIGNING METHOD THEREFOR

BACKGROUND OF THE INVENTION

1. Field of the Invention

The present invention relates to a method of designing a semiconductor integrated circuit device, and to a semiconductor integrated circuit device, and more particularly to a method of designing a semiconductor integrated circuit device capable of reducing overhead such as clock skews and clock jitters when designing a pipeline in an integrated circuit device, and to a configuration of a semiconductor integrated circuit device manufactured according to such designing method.

2. Description of the Background Art

In an LSI large scale integrated circuit), a synchronous multi-stage pipeline for processing/transferring a signal synchronously with a clock signal so as to transfer the signal/data at high speed, is widely used. In constituting such a synchronous multi-stage pipeline, flip-flops or latches are normally used as transfer circuits.

FIG. 9 is a diagram showing an example of the configuration of a two-stage pipeline constituted by flip-flops. In FIG. 9, the two-stage pipeline includes a flip-flop circuit FF01 which transfers an input signal IN synchronously with a clock signal CLK01, a logic circuit LG1 which performs a predetermined logic processing on the signal applied from flip-flop circuit FF01 and outputs a resultant signal, a flip-flop circuit FF02 which transfers the output signal of logic circuit LG1 synchronously with a clock signal CLK02, a logic circuit LG2 which performs a predetermined logic processing on the signal applied from flip-flop FF02 and outputs a resultant signal, and a flip-flop circuit FF03 which transfers the output signal of logic circuit LG2 synchronously with a clock signal CLK03 and generates an output signal/data OUT.

Since logic circuits LG1 and LG2 each perform a logic processing on the received signal for outputting, logic circuits LG1 and LG2 have logic delays L01 and L02 in the propagation of the signals, respectively.

Normally, logic circuits LG1 to LG2 each receive a plurality of signals and performs a logic processing. In the description given hereinafter, though not particularly mentioned, a flip-flop circuit FF transfers one or a plurality of signals. The number of signals transferred by flip-flop circuit FF is determined according to the configuration of a logic circuit LG arranged at the subsequent stage.

Flip-flop circuit FF01 has setup time SUP11 and hold time HLD11 for clock signal CLK01. In addition, flip-flop circuit FF01 has output delay time TPD11 since a trigger edge of clock signal CLK01 is applied until a valid signal is outputted.

Flip-flop circuit FF02 has setup time SUP12 and hold time HLD12 and output delay time TPD12.

Flip-flop circuit FF03 has setup time SUP13 and hold time HLD13 and output delay time TPD13.

Further, fixed skews due to uncertain factors of clock signals, as described later, exist for the clock signals applied to flip-flop circuits FF01 to FF03, respectively.

FIG. 10 is a diagram showing output delay time TPD, setup time SUP and hold time HLD shown in FIG. 9. FIG. 10 shows parameters in a case where flip-flop circuits FF01 to FF03 are each a rising edge trigger type flip-flop that latches and outputs a signal applied at the rising edge of clock signal CLK.

Setup time SUP is a time period for which input signal SIN is kept in a definite state with respect to the rising edge of clock signal CLK. Hold time HLD is a time period required for input signal SIN to be kept in a definite state since the rising edge of clock signal CLK. Output delay time TPD is a time period required since clock signal CLK rises until the output signal SOUT of the flip-flop circuit is made definite.

Normally, setup time SUP is determined under the worst condition for the operating parameters of transistors which constitute a flip-flop. Hold time HLD is calculated using the best operating parameters of the transistors which constitute the flip-flop.

Clock signal CLK has a period TK.

As shown in FIG. 11, clock signals CLK01 to CLK03 are applied from a clock distribution circuit 110 which receives a clock signal CLK0 generated from a clock generation circuit 100. Clock distribution circuit 110 transfers applied clock signal CLK0 to the respective the flip-flop circuits in the pipeline.

Clock generation circuit 100 is constructed by, for example, a PLL (phase locked loop), and generates internal clock signal CLK0 synchronized in phase with an external clock signal such as a system clock. Clock distribution circuit 110 takes various configurations such as a tree-like clock network and a fishbone type clock distribution circuit according to the configuration of this pipeline.

Clock signals CLK01 to CLK03 are transferred through predetermined routes, respectively. Therefore, clock signals CLK01 to CLK03 applied to flip-flop circuits FF01 to FF03 shown in FIG. 9 each have clock signal ambiguities referred to as a skew or a jitter. Thus, clock signals CLK01 to CLK03 are deviated from an ideal edge of a clock signal.

Here, in the description given hereinafter, "clock skew" is defined as a spatial clock signal deviation caused by process variation and uneven interconnection in clock distribution circuit 110. Namely, a clock skew indicates the phase deviation of a clock signal caused depending on the positional relationship between each of flip-flop circuits FF01 to FF03 and clock generation circuit 100.

As for the clock skews, fixed factors caused by the unevenness of interconnections and process variations based on layout dependency and uncertain factors dependent on unpredictable process variations and the power supply voltage change, temperature change in clock distribution circuit 110 and other are separately considered. The unevenness of interconnections indicates variations in line width and interconnection length and such. Layout dependent process variations indicate the variations of operating characteristics due to the variations of impurity concentration dependent on the layout in transistors constituting a repeater which is included in clock distribution circuit 110 and which transmits the clock signal.

A "clock jitter" is defined as a temporal clock signal deviation caused by the power supply voltage fluctuation, temperature fluctuation or the like in clock generation circuit (PLL) 100. It is, therefore, assumed that only uncertain factors exist for the clock jitters. Since the clock jitter is the temporal deviation of the clock signal, similar clock jitters occur to the respective flip-flop circuits.

Referring back to FIG. 9, a clock skew SKW01 between flip-flop circuits FF01 and FF02 and a clock skew SKW02 between flip-flop circuits FF02 and FF03 are fixed factor components of the clock skew. In addition, a clock skew between flip-flop circuits FF01 and FF03 is denoted by a reference symbol SKWA, which is also a fixed factor component of the clock skew. The fixed factor of the clock skew can take both positive and negative values. The fixed factor (SKW01, SKW02) of a skew of a clock signal delayed in phase from a given clock signal has a positive value (cycle time can be made longer with respect to a logic circuit at the preceding stage). Further, the fixed factor of the skew of a clock signal faster in phase than this clock signal takes a negative value.

The clock skew uncertain factor between flip-flop circuits FF01 and FF02 is equal to that between flip-flop circuits FF02 and FF03, and these factors are each defined to be an absolute value SKWET. This is because they are uncertain factors and the worst case is always supposed.

Furthermore, the clock jitter between flip-flop circuits FF01 and FF02 is equal to that between flip-flop circuits FF02 and FF03, and these jitters are each defined to be an absolute value JTR. It is noted that clock jitter JTR is a value per one cycle TK of the clock signal.

A skew MRG is defined to be the sum of jitter component JTR and clock skew uncertain factor SKWET.

Each of logic circuits LG1 and LG2 needs to perform a predetermined logic processing on the signal applied thereto and to transfer the resultant signal to the flip-flop at the next stage within a period of one cycle TK of clock signal CLK0.

FIG. 12 shows a time period (logic delay time) L which each of logic circuits LG1 and LG1 can use within one cycle period of clock signal CLK. Referring to FIG. 12, a period of one cycle TK of clock signal CLK covers output delay time TPD, signal logic delay time L of a logic circuit, jitter JTR, clock skew uncertain factor SKWET, setup time SUP of the flip-flop in the next stage, and clock skew fixed factor SKW of the flip-flop at the next stage. Jitter JTR indicates the magnitude of the changing range of the phase of the trigger edge (rising edge) of clock signal CLK.

In FIG. 12, therefore, it is necessary that each of logic circuits LG1 and LG2 satisfies the following setup conditional expressions:

$$L01 \leq TK-TPD01-SUP02+SKW01-SKWET-JTR \quad (1); \text{ and}$$

$$L02 \leq TK-TPD02-SUP03+SKW02-SKWET-JTR \quad (2).$$

As for the hold time, logic delay time L01 and L02 of respective logic circuits LG1 and LG2 need to satisfy the following hold conditions since it is necessary to prevent the output signal of a flip-flop circuit from changing within the hold time of the flip-flop circuit at the next stage:

$$LH01 \geq HLD02-TPDH01+SKWH01+SKWETH \quad (3); \text{ and}$$

$$LH02 \geq HLD03-TPDH02+SKWH02+SKWETH \quad (4).$$

The reason why no jitter JTR appears in the above hold conditional expressions is that a jitter occurs in each clock signal and the jitter components of the respective clock signals cancels out one another.

If LSI manufacturing process variations are considered, in general, it is often to use different values between the delay time used for the setup conditions and that used for the hold conditions. This is done for the following reasons. In a setup conditional expression, the case of the setup time being longer has to be taken into account. In a hold conditional expression, the case of the minimum hold time has to be taken into account in view of the conditions under which the flip-flop circuit in the next stage propagates a signal at the highest rate.

Therefore, by attaching symbol "H" to the ends of the corresponding reference symbols of the respective parameters under the setup conditions related to delay time, it is indicated that the parameters are those for the hold conditions. The logical delay time and the output delay time indicating the delay of the output of the flip-flop circuit relative to the rise of the clock signal are denoted by LH and TPDH, respectively. In addition, clock skews are in some cases considered under different conditions, as well. Therefore, by attaching symbol "H" to the end of the reference symbols related to the clock skews for the setup conditions, respectively, it is indicated that the parameters are those for the hold conditions.

In expressions (1) to (4), a part of or all of the fixed factors such as layout dependent process variations are in some cases required to be considered in clock skew uncertain factor SKWET, if they cannot be accurately calculated or there are restrictions on a CAD (computer-aided design) tool. For example, if a certain constant value is used for the clock skew between arbitrary flip-flop circuits due to the restrictions on the CAD tool, it is required to set the fixed factors SKW01 and SKW02 of the clock skew to 0 and to contain the maximum clock skew in the uncertain factor SKWET of the clock skew. In contrast, if variations due to the power supply voltage change, temperature change or the like can be accurately calculated or controlled, a part of or all of clock skew uncertain factor SKWET and jitter JTR can be considered in each of clock skew fixed factors SKW01 and SKW02 in some cases.

The following is defined for the variations of the uncertain factor:

$$SKWET+JTR=MRG.$$

Under this definition, above-stated setup conditional expressions (1) and (2) are modified as follows:

$$L01 \leq TK-TPD01-SUP02+SKW01-MRG \quad (5); \text{ and}$$

$$L02 \leq TK-TPD02-SUP03+SKW02-MRG \quad (6).$$

If only the maximum clock skew in an entire clock distribution system is considered for the clock skews, the clock skew maximum value is included in uncertain factor MRG, whereby setup conditional expressions (5) and (6) can be modified as follows:

$$L01 \leq TK-TPD01-SUP02-MRG \quad (7); \text{ and}$$

$$L02 \leq TK-TPD02-SUP03-MRG \quad (8).$$

Conditional expressions (7) and (8) are normally used when a pipeline is designed using flip-flops. In conditional expressions (5) and (6), a clock skew is calculated for each clock signal propagation path individually and logic circuits are designed according to the respective individual calculated values. In conditional expressions (7) and (8), all the paths (pipeline stages) are designed according to the maximum clock skew. Therefore, there exists a path (pipeline stage) to which longer logic delay time L than the logic delay time of an actual logic circuit is allocated between certain flip-flops.

From expressions (5) and (6), the condition for logic delay time L1+L2 between two pipeline stages is expressed as follows:

$$L01+L02 \leq 2 \cdot TK-TPD01-TPD02-SUP02-SUP03+SKW01+SKW02-2 \cdot MRG \quad (9).$$

If the clock skew fixed factor between flip-flop circuits FF01 and FF03 is defined as SKWA as shown in FIG. 9, this clock skew fixed factor SKWA can be regarded as the sum of the clock skew fixed factors of the respective pipeline stages. Namely, the following expression is defined:

$$SKW01+SKW02=SKWA.$$

If using this conditional expression, expression (9) can be modified as follows:

$$L01+L02 \leq 2 \cdot TK-TPD01-TPD02-SUP02-SUP03+SKWA \\ -2 \cdot MRG \quad (10)$$

$$\leq 2 \cdot TK-TPD01-TPD02-SUP02-SUP03+SKWA-2 \cdot (SKWET+JTR).$$

If the average delay time till the output of a flip-flop from the clock input of the flip flop is defined as Tpd and the average setup time of the flip-flops is defined as Sup, then the average value of the permissible maximum logic delay time between the two pipeline stages can be considered as follows:

$$L01+L02=2 \cdot TK-2Tpd-2 \cdot Sup+SKW-2 \cdot MRG \quad (11).$$

FIG. 13 is a schematic diagram showing the configuration of a three-stage pipeline using flip-flops. In FIG. 13, the three-stage pipeline includes flip-flop circuits FF11 to FF14 which transfer signals applied thereto synchronously with clock signals CLK11 to CLK14, respectively, a logic circuit LG11 which performs a logic processing on the signal/data received from flip-flop circuit FF11 and transfers the resultant signal/data to flip-flop circuit FF12, a logic circuit LG12 which performs a logic processing on the signal/data received from flip-flop circuit FF12 and transfers the resultant signal/data to flip-flop circuit FF13, and a logic circuit LG13 which performs a logic processing on the signal/data received from flip-flop circuit FF13 and transfers the resultant signal/data to flip-flop circuit FF14.

For flip-flop circuit FF11, output delay time TPD11, setup time SUP11, and hold time HLD11 are defined. For flip-flop circuit FF12, output delay time TPD12, setup time SUP12, and hold time HLD12 are defined. For flip-flop circuit FF13, output delay time TPD13, setup time SUP13, and hold time HLD13 are defined. For flip-flop circuit FF14, output delay time TPD14, setup time SUP14, and hold time HLD14 are defined.

For clock signals CLK11 to CLK14 applied to flip-flop circuits FF11 to FF14, respectively, uncertain factor MRG of the clock skew is defined.

Clock skew fixed factor SKW11 exists between clock signals CLK12 and CLK11, clock skew fixed factor SKW12 exists between clock signals CLK12 and CLK13, and clock skew fixed factor SKW13 exists between clock signals CLK13 and CLK14. Clock skew fixed factor SKWA exists between clock signals CLK14 and CLK11 to flip-flop circuits FF14 and FF11, respectively.

In the three-stage pipeline shown in FIG. 13, if logic circuits LG11, LG12 and LG13 have logic delay time L11, L12 and L13, respectively, logic delay time L11 to L13 is required to satisfy the following setup conditional expressions and the following hold conditional expressions as in the case of the two-stage pipeline stated above.

$$L11 \leq TK-TPD11-SUP12-SKW11-MRG \quad (12);$$

$$L12 \leq TK-TPD12-SUP13-SKW12-MRG \quad (13);$$

$$L13 \leq TK-TPD13-SUP14-SKW13-MRG \quad (14);$$

$$LH11 \geq HLD12-TPDH11+SKWH11+SKWETH \quad (15);$$

$$LH12 \geq HLD13-TPDH12+SKWH12+SKWETH \quad (16); \text{ and}$$

$$LH13 \geq HLD14-TPDH13+SKWH13+SKWETH \quad (17).$$

In expressions (15) to (17), the logic delay times of logic circuits LG11 to LG13 for the hold conditions are respectively denoted by reference symbols LH11 to LH13. Likewise, the output delay times of flip-flop circuits for the hold conditions are denoted by reference symbols TPDH11 to TPDH13, respectively. Likewise, as for the clock skew fixed factors, the clock skews for the hold conditions are denoted by reference symbols SKWH11 to SKWH13 and SKWETH, respectively.

In the above expressions, MRG is given by the sum of jitter JTR and clock skew uncertain factor SKWET as in the case of the two-stage pipeline. The reason why the jitter component is not considered in the hold conditional expressions is that a jitter similarly occurs to each clock signal and the jitters cancels out one another under the hold conditions as in the case of the two-stage pipeline.

In addition, clock skew fixed factor SKWA between flip-flop circuits FF14 and FF11 can be regarded as the sum of clock skew fixed factors SKW11, SKW12 and SKW13. Therefore, from expressions (12) to (14), the condition for logic delay time L11+L12+L13 between the three pipeline stages is expressed as follows:

$$L11+L12+L13 \leq 3 \cdot TK-TPD11-TPD12-TPD13-SUP12-SUP13- \\ SUP14-SKWA-3 \cdot MRG \quad (18).$$

If the average delay time of the outputs of the flip-flops relative to input of the associated clock signals of the flip-flops is defined as Tpd and the average setup time of the flip-flops is defined as Sup, then the average permissible maximum logic delay time between the three pipeline stages can be regarded as follows:

$$L11+L12+L13=3 \cdot TK-3 \cdot Tpd-3 \cdot Sup+SKWA-3 \cdot MRG \quad (19).$$

From conditional expressions (11) and (19), it is appreciated that if a pipeline is designed using flip-flops, it is necessary to consider output delay time Tpd, clock skew uncertain factor MRG and setup time Sup by as many as the number of pipeline stages included between arbitrary flip-flops.

With the improvement of the operating frequency of LSI, a clock cycle becomes shorter. In addition, with the high integration and miniaturization of transistors and interconnections, the influence of process variations becomes greater. Accordingly, the ratio of uncertain factors, such as skews and jitters, in the clock cycle increases. Further, as the operating frequency increases, it has become more difficult to improve delay time TPD of the output of a flip-flop from the clock input of the flip-flop and setup time SUP of the flip-flop. Therefore, the influence of output delay time TPD, clock skew uncertain factor MRG and setup time SUP on the logic delay time increases, thereby making it difficult to design a pipeline and making it impossible to optimally design a pipeline which operates at high speed.

SUMMARY OF THE INVENTION

It is an object of the present invention to provide a method of designing a semiconductor integrated circuit device allowing easy designing of a pipeline which operates at high speed.

It is another object of the present invention to provide a method of designing a pipeline, capable of decreasing the influence of the operating parameters, clock skews and the like of flip-flop circuits.

It is still another object of the present invention to provide a semiconductor integrated circuit device which includes a pipeline optimally designed to operate at high speed.

A method of designing a semiconductor integrated circuit device according to the present invention is a method of designing a semiconductor integrated circuit device which includes a pipeline including a plurality of flip-flop circuits each transferring a signal synchronously with a basic clock signal, and includes the steps of: designing the pipeline using the flip-flop circuits with the assumption that a cycle period of a transfer clock signal is given by a sum of a cycle of the basic clock signal and a gain time obtained by replacing a flip-flop circuit in the pipeline with latch circuits; setting the cycle period of the transfer clock signal to the cycle period of the basic clock signal to detect an error path in the designed pipeline; dividing the flip-flop circuit related to the error path into a plurality of latch circuits operating complementarily with each other and synchronously with the clock signal; and dividing a logic circuit related to the error path by the plurality of latch circuits such that a predetermined conditional inequality for signal propagation delay is satisfied for logic circuit stages related to the respective latch circuits, thereby rearranging the logic circuits.

A semiconductor integrated circuit device according to the first aspect of the present invention includes: a first flip-flop circuit transferring a received signal synchronously with a clock signal; a first latch circuit operating complementarily to the first flip-flop circuit and synchronously with the clock signal, and transferring and latching an applied signal; a first logic circuit arranged between the first flip-flop circuit and the first latch circuit, performing a logic processing on a signal applied from the first flip-flop circuit, and transferring the resultant signal to the first latch circuit; a second latch circuit operating complementarily to the first latch circuit and synchronously with the clock signal, and transferring and latching the applied signal; a second logic circuit arranged between the first latch circuit and the second latch circuit, performing a logic processing on the signal received from the first latch circuit, and transferring a resultant signal to the second latch circuit; a second flip-flop circuit operating complementarily to the second latch circuit and synchronously with the clock signal, and transferring the applied signal; and a third logic circuit arranged between the second latch circuit and the second flip-flop circuit, performing a logic processing on the signal from the second latch circuit, and transferring a resultant signal to the second flip-flop circuit. The first and second latch circuits and the first and second flip-flop circuits are arranged so as to satisfy the following conditions:

$$L1 \leq TK - TPDF1 - SUPL1 + SKW1 - SKET - JTR \quad (1);$$

$$L2 \leq TK - TPDL1 - SUPL2 + SKW2 - SKET - JTR \quad (2);$$

$$L3 \leq TK - TPDL2 - SUPF2 + SKW3 - SKET - JTR \quad (3);$$

$$L1 + L2 \leq (1 + HDY) \cdot TK - TPDF1 - SUPL2 + SKW4 - SKET - JTR \cdot K1 - THR1 \quad (4);$$

$$L2 + L3 \leq (1 + LDY) \cdot TK - TPDL1 - SUPF2 + SKW5 - SKET - JTR \cdot K2 - THR2 \quad (5);$$

$$L1 + L2 + L3 \leq 2 \cdot TK - TPDF1 - SUPF2 + SKWA - SKET - JTR \cdot K3 - THR1 - THR2 \quad (6);$$

$$L1 \geq HLDL1 - TPDFH1 + SKWH1 + SKETH \quad (7);$$

$$L2 \geq HLDL2 - TPDLH1 + SKWH2 + SKETH \quad (8); \text{ and}$$

$$L3 \geq HLDF2 - TPDLH2 + SKWH3 + SKWETH \quad (9).$$

In the above conditions, L1, L2 and L3 indicate logic delay time of the first, second and third logic circuits, respectively; TK indicates the cycle period of the basic clock signal; TPDF1 indicates a delay of a signal output of the first flip-flop circuit from the clock signal; TPDL1 and TPDL2 indicate delays of output signals of the first and second latch circuits relative to the clock signal; SKW1, SKW2 and SKW3 indicate skews of the clock signal for a clock signal applied to the circuit at a preceding stage, respectively; SKW4 indicates a skew of the clock signal applied to the second latch circuit for the clock signal applied to the first flip-flop circuit; SKW5 indicates the skew of the clock signal applied to the first latch circuit for the clock signal applied to the second flip-flop circuit; and SKWA indicates the skew of the clock signal applied to the second flip-flop circuit for the clock signal applied to the first flip-flop circuit; SUPL1, SUPL2 and SUPF2 indicate setup time of the first latch circuit, setup time of the second latch circuit, and setup time of the third latch circuit, respectively.

SKET indicates a fixed skew of the clock signal; JTR indicates a jitter of the clock signal for the clock signal of the circuit at the preceding stage; THR1 and THR2 indicate signal propagation delay time of the first latch circuit and signal propagation delay time of the second latch circuit, respectively, relative to the respective input clock signals; HDY and LDY indicate duties of the latching periods of the clock signal applied to the first and second latch circuits, respectively; K1, K2 and K3 indicate coefficients representing cycle dependency of the jitter; HLDL1 and HLDL2 and HLDF2 indicate hold time of the first latch circuit, the second latch circuit and the second flip-flop circuit for the clock signal, respectively; TPDFH1, TPDLH1 and TPDLH2 indicate delays of output signals of the first flip-flop circuit, the first latch circuit and the second latch circuit relative to the clock signal for the hold condition; SKWH1, SKWH2 and SKWH3 indicate skews of the clock signal for the clock signal applied to the circuit at the preceding stage for the hold condition; and SKETH indicates the fixed skew caused by the uncertain factor of the clock signal.

A semiconductor integrated circuit device according to the second aspect of the present invention includes: a first flip-flop circuit transferring an applied signal synchronously with a clock signal; a first logic circuit performing a logic processing on the signal from the first flip-flop circuit, and outputting the resultant signal; a first latch circuit operating complementarily to the first flip-flop circuit and synchronously with the clock signal, and transferring and latching an output signal of the first logic circuit; a second logic circuit performing the logic processing on the signal from the first latch circuit, and outputting the resultant signal; a second latch circuit operating complementarily to the first latch circuit and synchronously with the clock signal, and transferring and latching the output signal of the second logic circuit; a third logic circuit performing the logic processing on the output signal of the second latch circuit, and outputting the resultant signal; a third latch circuit operating complementarily to the second latch circuit and synchronously with the clock signal, and transferring and latching the output signal of the third logic circuit; a fourth logic circuit performing the logic processing on the output signal of the third latch circuit, and outputting the resultant signal; a fourth latch circuit operating complementarily to the third latch circuit and synchronously with the clock signal, and transferring and latching the output signal of the fourth logic circuit; a fifth logic circuit performing the logic processing on the output signal of the fourth latch circuit, and outputting the resultant signal; and a second flip-flop circuit operating in phase with the fourth latch circuit synchronously with the clock signal, and transferring the output signal of the fifth logic circuit. The logic delay time L1 to L5 of the first to fifth logic circuits, respectively, satisfy the following conditions:

$$L1 \leq TK-TPDF1-SUPL1+SKW1-MRG \quad (1);$$

$$L2 \leq TK-TPDL1-SUPL2+SKW2-MRG \quad (2);$$

$$L3 \leq TK-TPDL2-SUPL3+SKW3-MRG \quad (3);$$

$$L4 \leq TK-TPDL3-SUPL4+SKW4-MRG \quad (4);$$

$$L5 \leq TK-TPDL4-SUPF2+SKW5-MRG \quad (5);$$

$$L1+L2 \leq (1+HDY) \cdot TK-TPDF1-SUPL2-SKW21-MRGJ1-THR1 \quad (6);$$

$$L2+L3 \leq (1+LDY) \cdot TK-TPDL1-SUPL3-SKW22-MRGJ2-THR2 \quad (7);$$

$$L3+L4 \leq (1+HDY) \cdot TK-TPDL2-SUPL4-SKW23-MRGJ1-THR3 \quad (8);$$

$$L4+L5 \leq (1+LDY) \cdot TK-TPDL3-SUPF2-SKW24-MRGJ2-THR4 \quad (9);$$

$$L1+L2+L3 \leq 2 \cdot TK-TPDF1-SUPL3-SKW31-MRGJ3-THR1-THR2 \quad (10);$$

$$L2+L3+L4 \leq 2 \cdot TK-TPDL1-SUPL4-SKW32-MRGJ3-THR2-THR3 \quad (11);$$

$$L3+L4+L5 \leq 2 \cdot TK-TPDL2-SUPF2-SKW33-MRGJ3-THR3-THR4 \quad (12);$$

$$L1+L2+L3+L4 \leq (2+HDY) \cdot TK-TPDF1-SUPL4-SKW41-MRGJ4-THR1-THR2-THR3 \quad (13);$$

$$L2+L3+L4+L5 \leq (2+LDY) \cdot TK-TPDL1-SUPF2-SKW42-MRGJ5-THR2-THR3-THR4 \quad (14);$$

$$L1+L2+L3+L4+L5 \leq 3 \cdot TK-TPDF1-SUPF2-SKW51-MRGJ-THR1-THR2-THR3-THR4 \quad (15);$$

$$L1 \geq HLDL1-TPDFH1+SKWH1+MRGH \quad (16);$$

$$L2 \geq HLDL2-TPDLH1+SKWH2+MRGH \quad (17);$$

$$L3 \geq HLDL3-TPDLH2+SKWH3+MRGH \quad (18);$$

$$L4 \geq HLDL4-TPDLH3+SKWH4+MRGH \quad (19); \text{ and}$$

$$L5 \geq HLDF2-TPDLH4+SKWH5+MRGH \quad (20).$$

In the above conditions, TK indicates the cycle period of the basic clock signal; TPDF1 indicates a delay time of a signal output of the first flip-flop circuit relative the clock signal; TPDL1 to TPDL4 indicate delays of output signals of the first to fourth latch circuits relative to a trigger edge of the clock signal; SUPL1 to SUPL4 indicate setup time of the first to fourth latch circuits for the clock signal; SUPF2 indicates the setup time of the second flip-flop circuit for the clock signal; SKW1 to SKW5 indicate skews of the clock signal for a clock signal applied to a circuit at the preceding stage; SKW21 to SKW24 indicate skews of clock signals for consecutive two stages of logic circuits of the first to fifth logic circuits; SKW31 to SKW33 indicate skews of clock signals for consecutive three stages of logic circuits of the first to fifth logic circuits; SKW41 and SKW42 indicate skews of clock signals of the first to fifth logic circuits for consecutive four stages of logic circuits; SKW51 indicates the skew of the clock signal applied to the second flip-flop circuit for the clock signal applied to the first flip-flop circuit; THR1 to THR4 indicate signal propagation delay time of the first to fourth latch circuits; HDY indicates a duty of the clock signal in a latching period of each of the first and third latch circuit; LDY indicates the duty of the clock signal in the latching state of each of the second and fourth latch circuit; MRG indicates a margin of the clock signal for a component including a jitter; MRGJ1 to MRGJ5 indicate margins for the clock signal with cycle dependency of the jitter taken into account; HLDL1 to HLDL4 indicate hold time of the first to fourth latch circuits for the clock signal, respectively; HLDF2 indicates the hold time of the second flip-flop circuit for the clock signal; TPDF1 indicates the delay of the output signal of the first flip-flop circuit from the trigger edge of the clock signal for the hold condition; TPDLH1 to TPDLH4 indicate the delays of output signals of the first to fourth latch circuits relative to the trigger edge of the clock signal; SKWH1 to SKWH5 indicate the skews of the clock signal for the clock signal applied to the circuit at the preceding stage for the hold conditions; and MRGH indicates the margin for the clock signal for the hold conditions.

By replacing a flip-flop circuit by a pair of complementarily operating latch circuits, it is possible to replace the output delay time of the flip-flop circuit, clock skews and the like by the data through time of the latch circuits. It is thereby possible to set the permissible maximum logic delay time of the pipeline stage of interest longer and to mitigate the conditions on the arrangement of the logic circuits.

In addition, since the inequalities are used as the conditional expressions, it is possible to provide an allowance for the arrangement position of each latch circuit when arranging the latch circuits, resulting in easy division of the logic circuit.

Furthermore, by dividing the logic circuit by the latch circuits, a path having a margin in logic delay time is formed. Therefore, by rearranging the circuits on this path, it is possible to reduce a circuit area.

Moreover, by arranging such a pipeline in the semiconductor integrated circuit device, it is possible to achieve a semiconductor integrated circuit device which stably operates synchronously with a high-speed clock signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
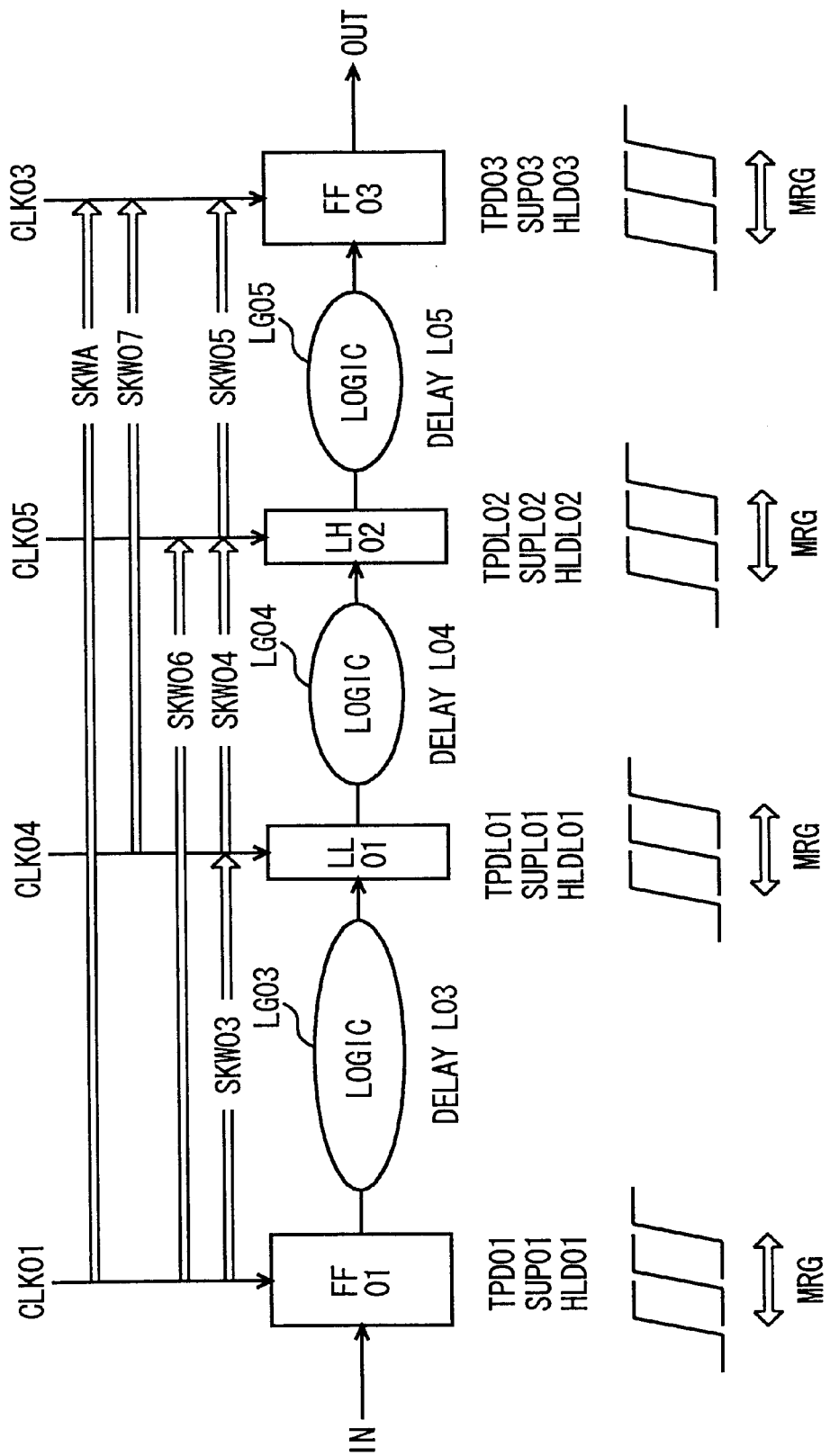
FIG. 1 is a schematic diagram showing the configuration of a two-stage pipeline according to the first embodiment of the present invention.

FIG. 1 is a schematic diagram showing the configuration of a multiple-stage pipeline according to the first embodiment of the present invention. The multiple-stage pipeline shown in FIG. 1 is equivalent in configuration to the two-stage pipeline shown in FIG. 9, except that flip-flop circuit FF02 is replaced by latch circuits LL11 and LH02. According to this configuration, the configuration of logic circuits constituting the pipeline differs for different insertion positions of latch circuits LL01 and LH02. A logic circuit LG03 is arranged between flip-flop circuit FF01 and latch circuit LL01. A logic circuit LG04 is arranged between latch circuits LL01 and LH02. A logic circuit LG05 is arranged between latch circuit LH02 and flip-flop circuit FF03.

Latch circuits LL01 and LL02 transfer/latch one or a plurality of signals/data synchronously with clock signals CLK04 and CLK05, respectively, depending on the circuit configuration of the respective logic circuits.

Clock signals CLK01 and CLK03 are applied to flip-flop circuits FF01 and FF03, respectively. Flip-flop circuits FF01 and FF03 output the applied signals synchronously with the rise of clock signals CLK01 and CLK03, respectively.

Latch circuit LL01 is a low active latch circuit. When a clock signal CLK04 is at L level, latch circuit LL01 turns into a through state in which latch circuit LL01 allows the applied signal to pass. When clock signal CLK04 is at H level, latch circuit LL01 turns into a latching state to isolate the input and output thereof.

Latch circuit LH02 is a high active latch circuit. When a clock signal CLK05 is at H level, latch circuit LH02 turns into the through state. When clock signal CLK5 is at L level, latch circuit LH02 turns into the latching state.

Output delay time TPD01, setup time SUP01 and hold time HLD01 are defined for flip-flop circuit FF01. Output delay time TPDL01, setup time SUPL01 and hold time HLDL01 are defined for latch circuit LL01.

Output delay time TPDL02, setup time SUPL02 and hold time HLDL02 are defined for latch circuit LH02.

Output delay time TPD03, setup time SUP03 and hold time HLD03 are defined for flip-flop circuit FF03.

For each of clock signals CLK01, CLK03, CLK04 and CLK05 applied to flip-flop circuits FF01 and FF03 and latch circuits LL01 and LH02, respectively, clock skew uncertain factor MRG exists.

Logic circuits LG03 to LG05 have logic delay time L03, L04 and L05, respectively.

Figure 2:
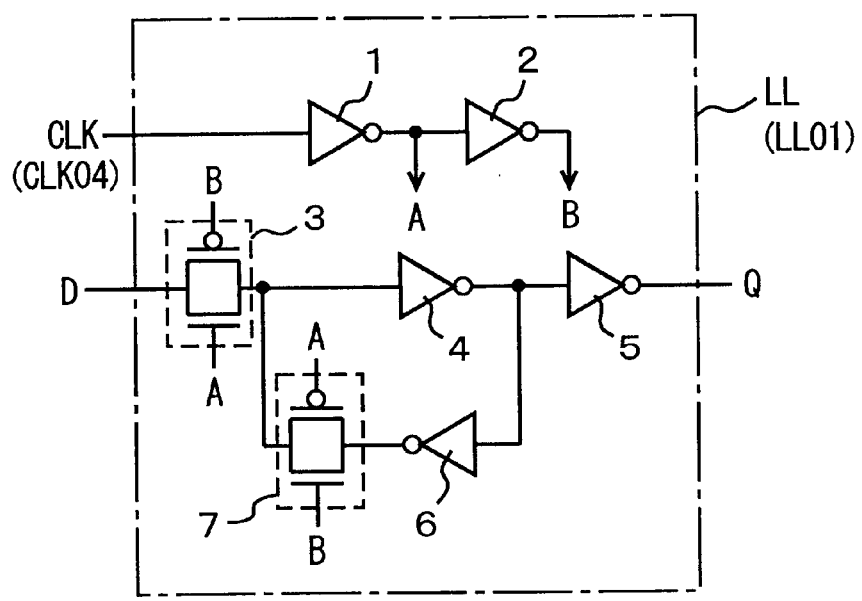
FIG. 2 is a diagram showing an example of the configuration of a low active latch circuit shown in FIG. 1.

FIG. 2 is a diagram showing an example of the configuration of low active latch circuit LL01 shown in FIG. 1. In FIG. 2, the configuration of a low active latch which transfers/latches one signal is shown. In low active latch circuit LL, the low active latch shown in FIG. 2 is arranged for each of the output signals/data of logic circuit LG03 at the preceding stage.

In FIG. 2, low active latch circuit LL (LL01) (low active latch) includes cascaded inverters 1 and 2 which receive clock signal CLK (CLK04), a CMOS transmission gate 3 which is selectively rendered conductive in accordance with the signals at outputs A and B of inverters 1 and 2, respectively and which allows a signal applied to an input D to pass when rendered conductive, an inverter 4 which receives the signal transferred through CMOS transmission gate 3, an inverter 5 which inverts the output signal of inverter 4 for transmission to an output Q, an inverter 6 which inverts the output signal of inverter 4, and a CMOS transmission gate 7 which is rendered conductive in response to the output signals of inverters 1 and 2 complementarily to CMOS transmission gate 3 and transferring the output signal of inverter 6 to the input of inverter 4 when rendered conductive.

In low active latch circuit (low active latch) LL, when clock signal CLK is at H level, the output signal of inverter 1 attains L level, the output signal of inverter 2 attains H level, CMOS transmission gate 3 turns into a nonconductive state and CMOS transmission gate 7 turns into a conductive state. In this state, inverters 4 and 6 constitute a latch circuit, low active latch circuit LL turns into a latching state and input D and output Q are disconnected from each other.

On the other hand, when clock signal CLK is at L level, the output signal of inverter 1 attains H level, the output signal of inverter 2 attains L level, CMOS transmission gate 3 turns into a conductive state and CMOS transmission gate 7 turns into a nonconductive state. Therefore, the signal applied to input D is transmitted to output Q through CMOS transmission gate 3 and inverters 4 and 5, and low active latch circuit LL turns into a through state.

Figure 3:
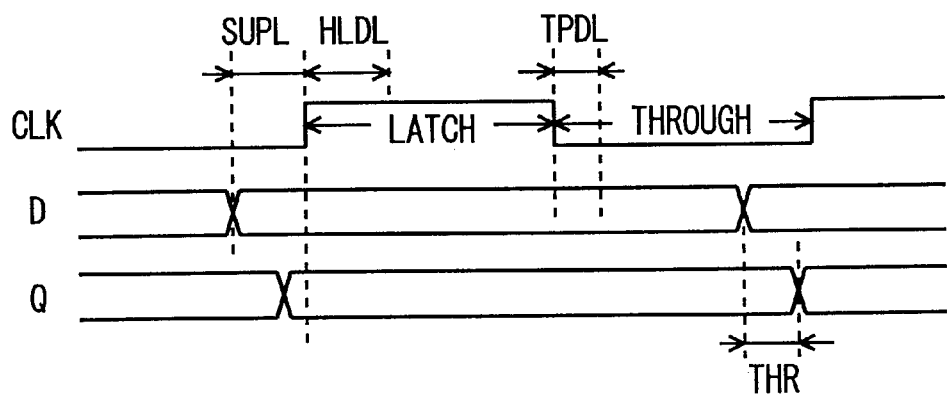
FIG. 3 is a signal waveform diagram representing an operation of the low active latch circuit shown in FIG. 2.

As shown in FIG. 3, low active latch circuit LL has setup time SUPL and hold time HLDL for the rising edge of clock signal CLK. On the other hand, output delay time TPDL of low active latch circuit LL is defined with respect to the falling edge of clock signal CLK. This is because the output delay time of the low active latch circuit indicates a response delay generated when the low active latch circuit changes from a latching state to a through state and the output signal of low active latch circuit LL changes.

As shown in FIG. 3, if the signal applied to input D changes when low active latch circuit LL is in a through state, the output Q of the low active latch circuit LL changes with a delay of propagation delay time (data though time) THR thereof.

Figure 4:
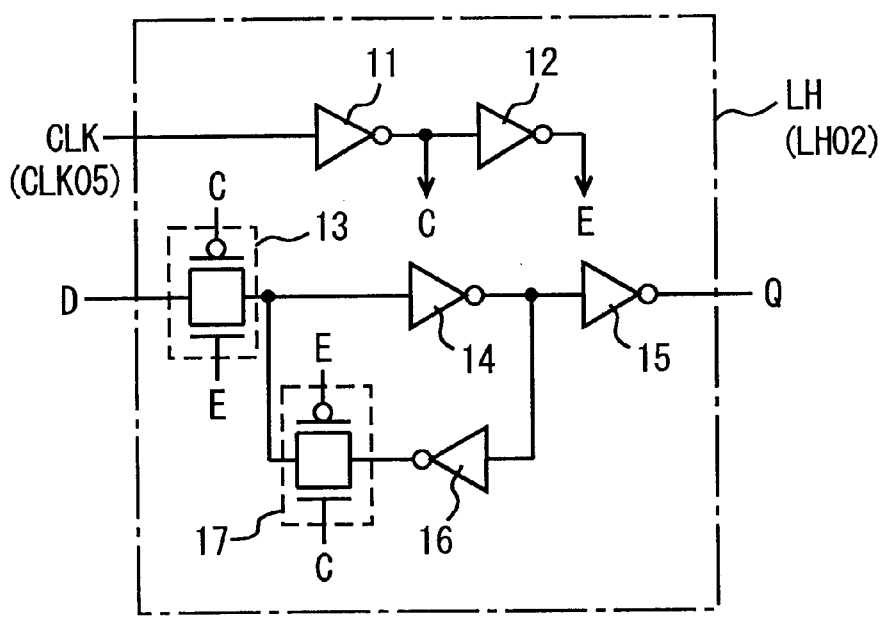
FIG. 4 is a diagram showing one example of the configuration of a high active latch circuit shown in FIG. 1.

FIG. 4 is a diagram showing an example of the configuration of high active latch circuit LH02 shown in FIG. 1. In FIG. 4, a high active latch circuit has a configuration of a high active latch arranged for one signal. The high active latch shown in FIG. 4 is arranged for each of the output signals/data of logic circuit LG04 at the preceding stage.

In FIG. 4, high active latch circuit LH (LH02) (high active latch) includes cascaded inverters 11 and 12 which receive clock signal CLK (CLK05), a CMOS transmission gate 13 which is selectively rendered conductive in accordance with signals from outputs C and E of inverters 11 and 12, respectively and allows a signal/data applied to input D to pass when rendered conductive, an inverter 14 which inverts the signal transferred through CMOS transfer gate 13, an inverter 15 which inverts the output signal of inverter 14 for transmission to output Q, an inverter 16 which inverts the output signal of inverter 14, and a CMOS transmission gate 17 which is rendered conductive in response to the output signals of inverters 11 and 12 complementarily to CMOS transmission gate 13, for transmitting the output signal of inverter 16 to the input of inverter 14 when rendered conductive.

In high active latch circuit LH, when clock signal CLK is at L level, the output signal of inverter 11 attains H level, the output signal of inverter 12 attains L level, CMOS transmission gate 13 turns into a nonconductive state and CMOS transmission gate 17 turns into a conductive state. Accordingly, high active latch circuit LH turns into a latching state, in which input D and output Q are disconnected from each other. In this latching state, inverters 14 and 16 latch a signal/data.

When clock signal CLK is at H level, the output signal of inverter 11 attains L level, the output signal of inverter 12 attains H level, CMOS transmission gate 13 turns into a conductive state and CMOS transmission gate 17 turns into a nonconductive state. In this state, high active latch circuit LH turns into a through state in which the signal/data applied to input D is transferred to output Q.

Figure 5:
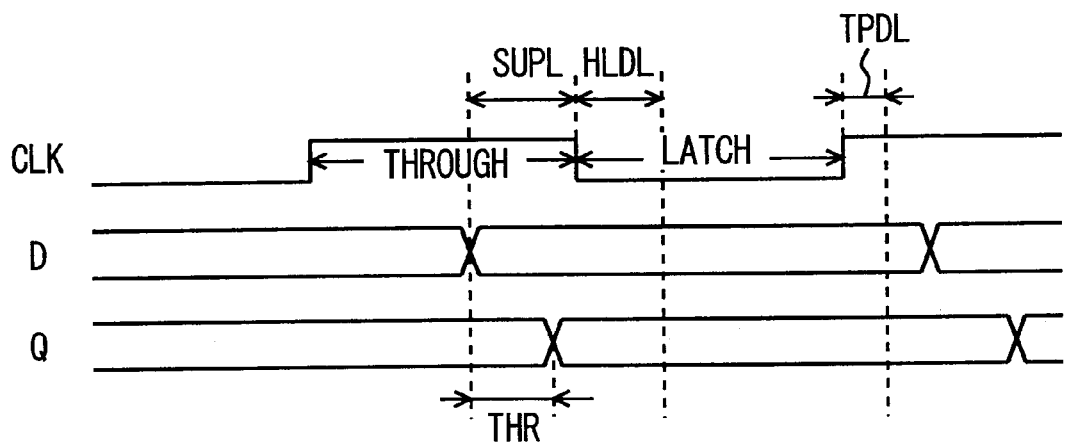
FIG. 5 is a signal waveform diagram representing an operation of the high active latch circuit shown in FIG. 4.

In the high active latch circuit shown in FIG. 4, setup time SUPL and hold time HLDL are defined for the falling edge of clock signal CLK and output delay time TPDL is defined for the rising edge of clock signal CLK as shown in FIG. 5. In addition, in high active latch circuit LH, propagation delay time (data through time) THR required until the signal applied to input D is transferred to output Q exists.

Referring back to FIG. 1, a clock skew fixed factor SKW03 exists between the clock signal of flip-flop circuit FF01 and that of latch circuit LL01. A clock skew fixed factor SKW04 exists between the clock signals of latch circuits LL01 and LH02. A clock skew fixed factor SKW05 exists between the clock signal of latch circuit LH02 and that of flip-flop circuit FF03.

In addition, a clock skew fixed factor SKW06 exists between the clock signal of flip-flop circuit FF01 and that of latch circuit LH02. A clock skew fixed factor SKW07 exists between the clock signal of latch circuit LL01 and that of flip-flop circuit FF03.

A clock skew fixed factor SKWA exists between the clock signals of flip-flop circuits FF01 and FF03.

Since a clock jitter uncertain factor is considered to have cycle or period dependency, jitter JTR per one clock cycle is multiplied by a coefficient.

Under these conditions, logic delay time L03 to L05 of the respective logic circuits in the pipeline shown in FIG. 1 are required to satisfy the following setup conditional expressions (20) to (25) and hold conditional expressions (26) to (28).

$$L03 \leq TK-TPD01-SUPL01+SKW03-SKWET-JTR \quad (20);$$

$$L04 \leq TK-TPDL01-SUPL02+SKW04-SKWET-JTR \quad (21);$$

$$L05 \leq TK-TPDL02-SUP03+SKW05-SKWET-JTR \quad (22);$$

$$L03+L04 \leq (1+HDY) \cdot TK-TPD01-SUPL02+SKW06-SKWET-JTR \cdot K01-THR01 \quad (23);$$

$$L04+L05 \leq (1+LDY) \cdot TK-TPDL01-SUP03+SKW07-SKWET-JTR \cdot K02-THR02 \quad (24);$$

$$L03+L04+L05 \leq 2 \cdot TK-TPD01-SUP03+SKWA-SKWET-JTR \cdot K03-THR01-THR02 \quad (25);$$

$$LH03 \geq HLDL01-TPDH01+SKWH03+SKWETH \quad (26);$$

$$LH04 \geq HLDL02-TPDLH01+SKWH04+SKWETH \quad (27); \text{ and}$$

$$LH05 \geq HLD03-TPDLH02+SKWH05+SKWETH \quad (28).$$

In the above expressions, THR01 and THR02 indicate the data through time of latch circuit LL01 and that of latch circuit LH02, respectively. For the hold conditions, different parameter values are used and symbol "H" is attached to the ends of corresponding parameter symbols for the setup conditions, respectively. The same holds for the following description with respect to the parameter symbols for the setup conditions. Though different in symbols, the logic delay time of each of the logic circuits in an actually designed pipeline satisfies both the setup conditions and the hold conditions.

HDY and LDY indicate the ratios of the H-level period and L-level period of the clock signal to one cycle period of the clock signal, respectively. It is assumed that the relationship of HDY+LDY=1 holds.

The delay time (output delay time TPD) of the output of flip-flop circuit FF01 relative to the clock input thereto can be considered to be equal to that used in the above-stated conditional expression (10) for the following reason. Although logic circuits LG01 and LG03 differ in overall configuration, the configuration of the part of the circuit connected to flip-flop circuit FF01 is the same as that shown in FIG. 9.

Figure 9:
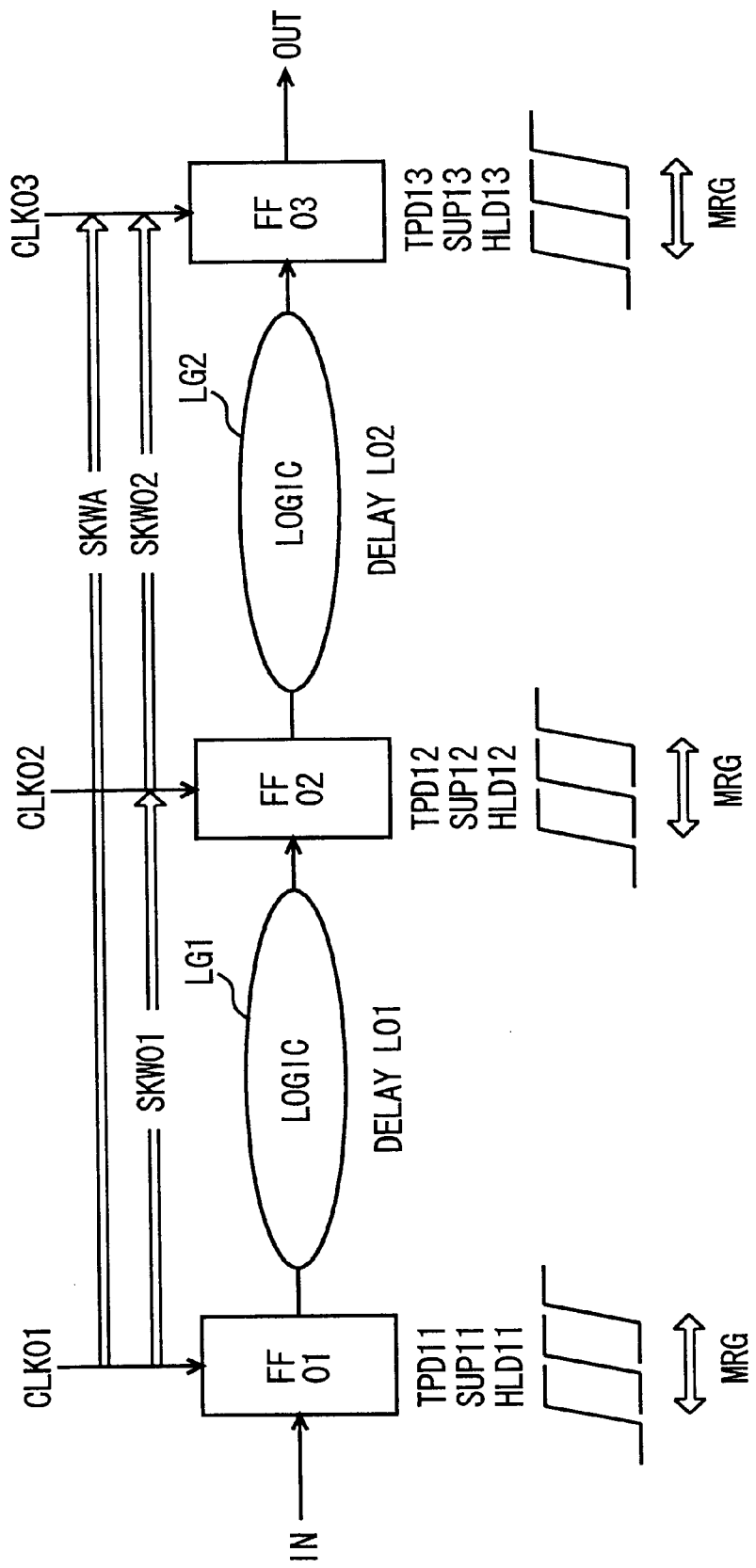
FIG. 9 is a schematic diagram showing the configuration of a two-stage pipeline according to a flip-flop design.
Figure 10:
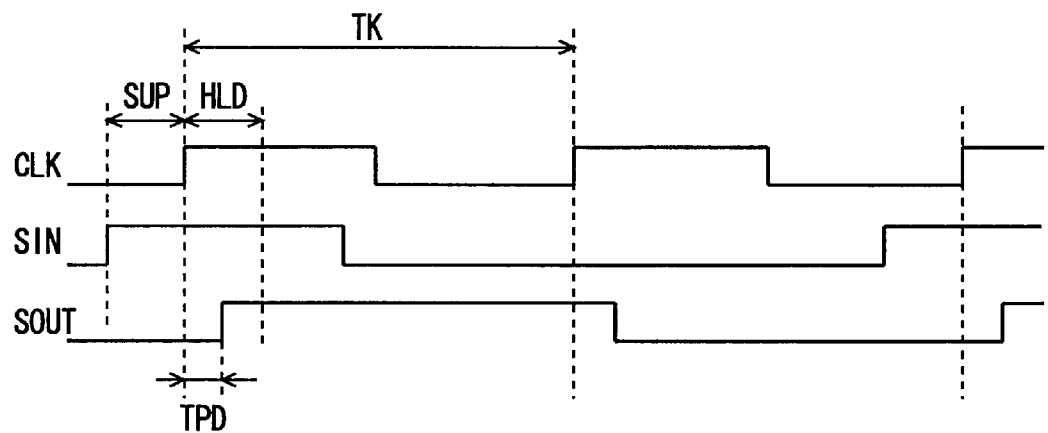
FIG. 10 shows parameters shown in FIG. 9.
Figure 11:
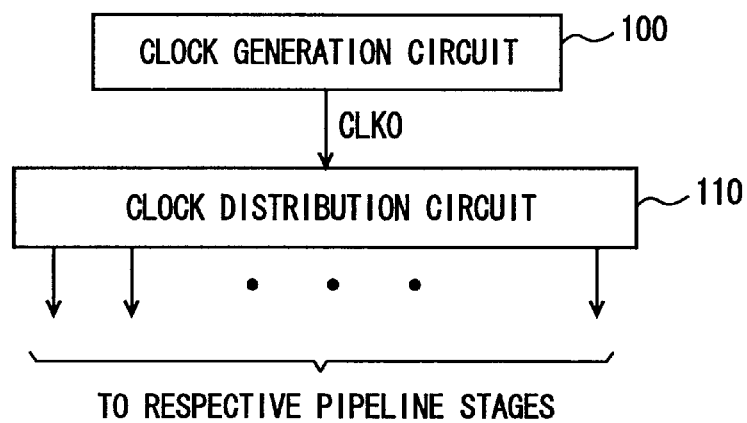
FIG. 11 is a schematic diagram showing the configuration of a clock distribution system for the pipeline.
Figure 12:
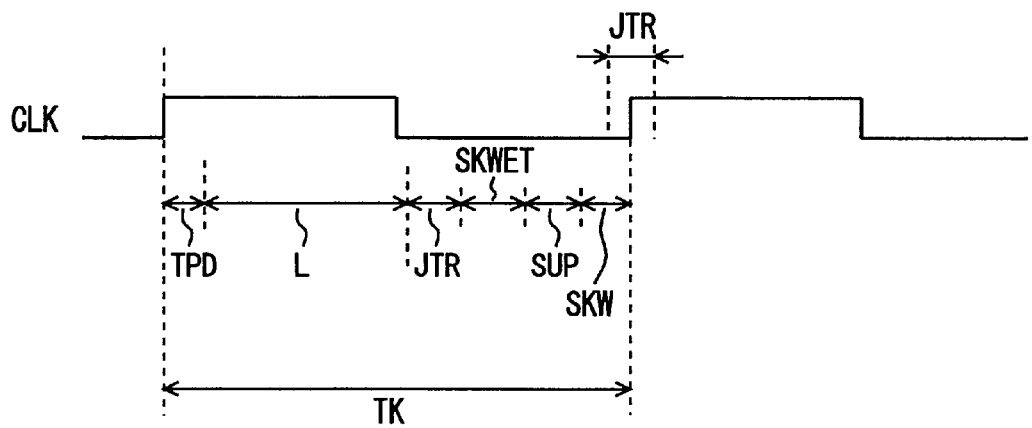
FIG. 12 is a view showing the relationship between the logic delay time of the logic circuit of the two-stage pipeline and the parameters.

In addition, the setup time of flip-flop circuit FF03 does not significantly differ from that shown in FIG. 9 since the logical paths over several stages preceding this flip-flop circuit FF03 are equal to those in FIG. 9. Accordingly, in conditional expressions (20) to (25), the same values are used for output delay time TPD01 and setup time SUP03 as those used in conditional expression (10).

A clock jitter or the like changes according to the change of the cycle period of the clock signal. Normally, a jitter in a one-cycle time period is greater than that over a two-cycle time period. In this way, it may be considered that a jitter value becomes greater as the clock cycle period of interest is longer (the number of logic paths between the associated clock signals increases). Therefore, coefficients K01 to K03 indicating the cycle period dependencies of the clock jitter uncertain factor are normally not less than 1 and coefficient K03 often takes a value greater than the values of coefficients K01 and K02.

HDY and LDY indicate duties of the H-level period and L-level period of clock signal CLK, respectively. If the values of duties HDY and LDY cannot be accurately calculated or controlled, it is necessary to include these duties HDY and LDY in clock skew uncertain factor SKWET.

Further, to be strict, data through time THR02 in conditional expression (25) differs in value from that in conditional expression (24). However, since logic paths over several stages preceding high active latch circuit LH02 are the same for the both conditions, the data through time is considered not to significantly differ between both the conditions and the same value is used for both the conditions.

Furthermore, to be strict, the values of logic delay time L03 to L05 used in conditional expressions (20) to (25) differ. However, for the same reason, they are considered not to significantly differ and the same values are used for the respective logic delay time L03 to L05 in conditional expressions (20) to (25).

If reference is made to conditional expressions (26) to (28) which represent the hold conditions, it is appreciated that they are equivalent to conditional expressions (3) and (4) for the hold conditions set in designing a pipeline with only flip-flops, and that the number of conditional expressions simply increases by one.

If a clock jitter is assumed to have no cycle period dependency, the following condition can be considered to hold: coefficients K01=K02=K03=1. Under this assumption, if it is defined that SKWET+JTR=MRG as in the case of the flip-flop design, then setup conditional expressions (20) to (25) can be modified as follows:

$$L03 \leq TK-TPDL01-SUPL01+SKW03-MRG \quad (29);$$

$$L04 \leq TK-TPDL01-SUPL02+SKW04-MRG \quad (30);$$

$$L05 \leq TK-TPDL02-SUP03+SKW05-MRG \quad (31);$$

$$L03+L04 \leq (1+HDY)\cdot TK-TPD01-SUPL02+SKW06-MRG-THR01 \quad (32);$$

$$L04+L05 \leq (1+LDY)\cdot TK-TPDL01-SUP03+SKW07-MRG-THR02 \quad (33); \text{ and}$$

$$L03+L04+L05 \leq 2\cdot TK-TPD01-SUP03+SKWA-MRG-THR01-THR02 \quad (34).$$

The average delay time of the outputs of flip-flops relative to the clock input of the corresponding flip-flops, the average setup time of the flip-flops, and the average data through time of latch circuits LL01 and LH02 are defined as Tpd, Sup and Thr, respectively. The average permissible maximum logic delay time in the two-stage pipeline configuration is expressed as follows:

$$L03+L04+L05=2\cdot TK-Tpd-Sup+SKWA-MRG-2\cdot Thr \quad (35).$$

As shown in FIG. 1, if a pipeline is designed using latch circuits, data Tpd, MRG and Sup need to be considered only once in the pipeline of two stages. That is, by constituting logic circuits using latch circuits with penalty of data though time Thr corresponding to the number of these latch circuits, it is possible to partially cancel data Tpd, MRG and Sup. However, it should be noted that even if conditional expressions (29) to (34) are all satisfied, the maximum delay time in expression (34) or (35) may not be effectively used in some case, depending on the conditions of logic delay times L03 to L05.

The right sides of conditional expressions (10) and (34) each represent the permissible maximum logic delay time in two-stage pipeline. It is seen that if the difference between the right sides of conditional expressions (10) and (34) is obtained, the pipeline configuration in which the latch circuits are used is advantageous in delay time by the value of the following MRTP2·2:

$$MRTP2\cdot 2=TPD02+SUP02+MRG-THR01-THR02 \quad (36).$$

Accordingly, if the values of data through time THR01 and THR02 of the latch circuits are sufficiently small, the value of conditional expression (36) becomes positive and the pipeline design using the latch circuits is advantageous over that using only flip-flop circuits in terms of delay time.

MRTP2·2 in conditional expression (36) indicates the gain of the two-stage pipeline. A gain MRTP2 of one stage pipeline is expressed as follows:

$$MRTP2=(\frac{1}{2})\cdot (TPD02+SUP02+MRG-THR01-THR02) \quad (37).$$

In addition, if the difference between the right sides of conditional expressions (11) and (35) is obtained to be reduced into a gain in a one-stage pipeline, then the permissible maximum delay time of the pipeline design using the latch circuits can be increased by the following value:

$$MRTP2=(\frac{1}{2})\cdot (Tpd+Sup+MRG-2\cdot Thr) \quad (38).$$

If the condition of MRG>>Tpd+Sup−2·Thr is satisfied, conditional expression (38) can be further simplified and the pipeline design using the latch circuits is advantageous by the following value:

$$MRTP2=(\frac{1}{2})\cdot MRG \quad (39).$$

If the cycle period dependency of the uncertain factors of the clock skew and the clock jitter are considered, it is necessary to obtain the difference between the right sides of conditional expressions (10) and (25). In this case, it is seen that if the difference is reduced into to the gain of one stage pipeline, the pipeline design using the latch circuits is advantageous by the following value:

$$MRTP2=(\frac{1}{2})\cdot \{Tpd+Sup+SKWET+(2-K3)\cdot JTR-2\cdot Thr\} \quad (40).$$

If the values of conditional expressions (37) to (40) which indicate a gain in latch design are greater, the logic delay time can be made longer by making use of the advantage of the latch design. Therefore, by designing a pipeline using latch circuits in accordance with the following designing flow, the pipeline can be easily designed.

Step 01: Design a pipeline using flip-flops with the clock cycle period assumed being "TK+MRTP2".

Step 02: Detect a critical path on which a setup error occurs for a target clock cycle period TK.

Step 03: Divide one flip-flop related to an error path into a low active latch circuit and a high active latch circuit. If the flip-flop circuit is a rising edge type circuit, the low active latch circuit is arranged at a preceding stage and the high active latch circuit is arranged at a subsequent stage. Conversely, if the flip-flop circuit is a falling edge circuit, the high active latch circuit is arranged at a preceding stage and the low active latch circuit is arranged at a subsequent stage.

Step 04: Move the logic circuit of the error path partially or entirely to a location between the latches so as to satisfy conditional expressions (20) to (28) or (29) to (34).

FIGS. 6A to 6D are diagrams showing latch design procedures for the two-stage pipeline according to the first embodiment. Referring to FIGS. 6A to 6D, the latch design procedures for the two-stage pipeline will be described.

Figure 6:
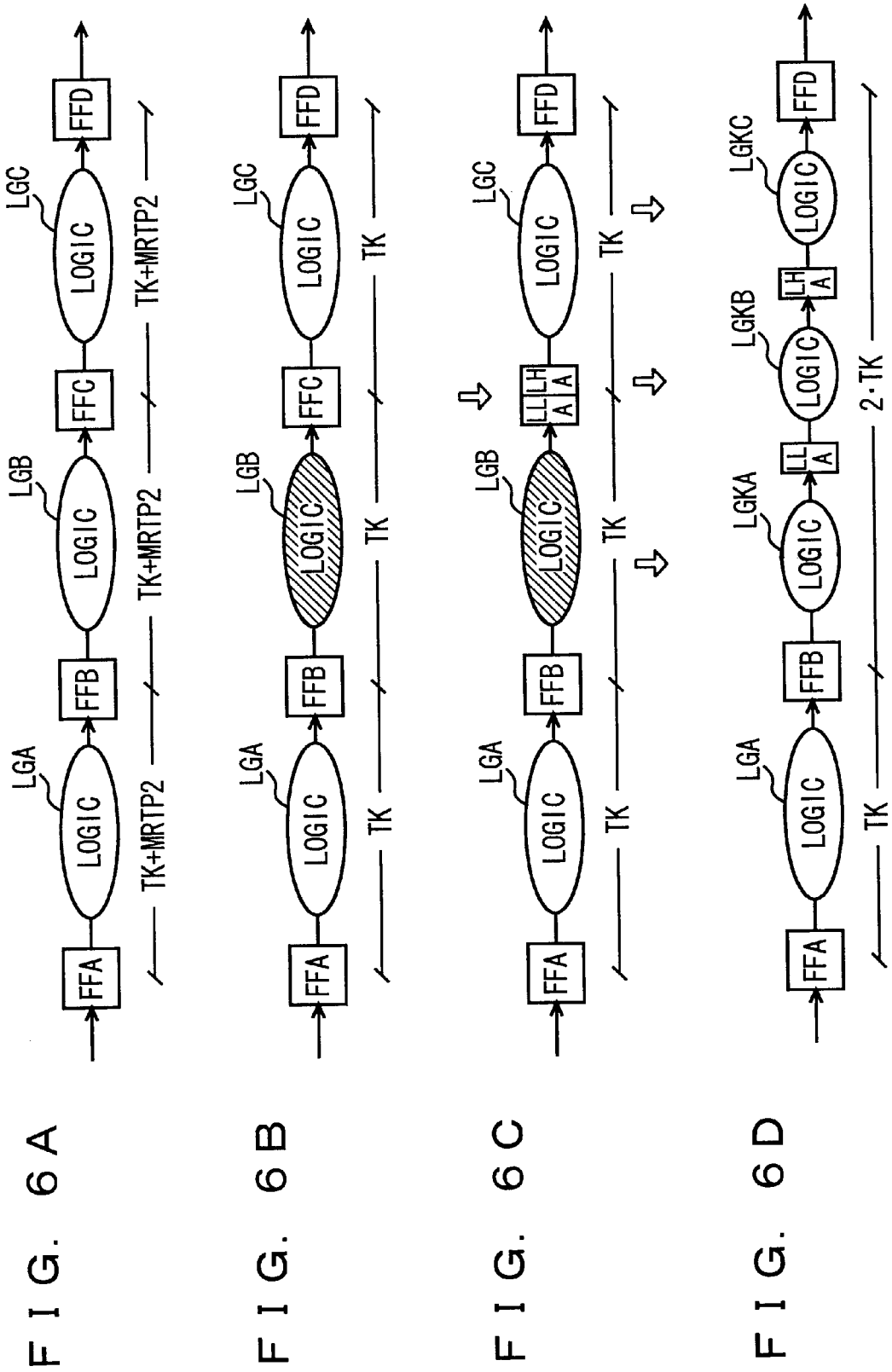
FIGS. 6A to 6D are flow chart showing a pipeline designing flow according to the first embodiment of the present invention.

As shown in FIG. 6A, in step 01, one cycle period of the clock signal is set to TK+MRTP2 and a pipeline having a necessary number of stages is formed using flip-flop circuits. To eventually constitute the pipeline using latch circuits, clock cycle period TK+MRTP2 accounting for latch gain MRTP2, rather than target clock cycle TK, is used. It is ideal to calculate gain MRTP2 using the most accurate conditional expression (40). However, if it is difficult to actually apply conditional expression (40) to the flip-flop design due to restrictions by the use of an existing logic configuring or synthesis tool, the reduction of logic design time and others, then any one of conditional expressions (37) to (39) can be used.

In FIG. 6A, flip-flop circuits FFA to FFD are arranged, a logic circuit LGA is arranged between flip-flop circuits FFA and FFB, a logic circuit LGB is arranged between flip-flop circuits FFB and FFC and a logic circuit LGC is arranged between flip-flop circuits FFC and FFD.

Next, as shown in FIG. 6B, in step 02, the clock cycle period is returned to normal cycle period TK and an error path on which an error occurs (for the setup conditions) is detected. The reason for detecting a path on which an error occurs for the setup conditions is as follows. The logic circuits are so arranged as to satisfy the hold and setup conditions under the state that the clock signal cycle period is long. If the clock signal cycle period is set to a target cycle period, the hold conditions are satisfied. Therefore, it is unnecessary to detect an error for the hold conditions and error path detection time is thereby reduced.

In FIG. 6B, logic circuit LGB is detected as the error path. To detect this error path, a calculation method using a logic configuring or synthesis tool, a method of performing the calculation in the back annotation for extracting inductance, capacitance, resistance and the others to calculate delay time, or other method can be used.

The flip-flop circuit related to the error path is replaced by a low active latch circuit and a high active latch circuit. If any of the flip-flop circuits at the preceding stage and the subsequent stage of this error path can be divided into latch circuits, the flip-flop circuit to be divided is determined according to the delay conditions of the preceding path and the subsequent path. If this flip-flop circuit to be divided is a rising edge type flip-flop circuit, low active latch circuit LL is arranged at the preceding stage and high active latch circuit LH is arranged in the subsequent stage. In FIG. 6C, flip-flop circuit FFC in the rear of the error path is replaced by a low active latch circuit LLA and a high active latch circuit LHA.

Next, as shown in FIG. 6D, in step 04, logic circuits LGB and LGC related to the error path are divided into three logic circuits LGKA, LGKB and LGKC in accordance with conditional expressions (26) to (28) for the hold conditions and conditional expressions (20) to (25) or (29) to (34) for the setup conditions, as latch design conditional expressions. As a result of this division, logic circuit LGKA is arranged between flip-flop circuit FFB and low active latch circuit LLA, logic circuit LGKB is arranged between latch circuits LLA and LHA, and logic circuit LGKC is arranged between high active latch circuit LHA and flip-flop circuit FFB.

A two-clock period 2·TK is allocated to the path from flip-flop circuits FFB to FFD.

For the pipeline stages constituted of logic circuits LGKA to LGKC, gain MRTP2·2 in the maximum logic delay time can be obtained compared with a case of using flip-flop circuits. That is, it is possible to increase the logic delay time that can be inserted into one pipeline stage. The increase MRTP2 of the permissible logic delay time makes it possible to improve delay convergence time and to expect the reduction of the design time period accordingly. It is also possible to incorporate a more complicated logic into each pipeline stage.

Furthermore, because of the increased allowable logic delay time, the number of paths each having a margin for the actual delay time increases. On such a path, a logic improvement such as the adjustment of a transistor size or the change of a 2-input AND gate into a 4-input AND gate can be made, thereby making it possible to reduce the area of the logic circuit.

Moreover, since inequalities are used as the conditional expressions for the logic delay time of the logic circuits, it is possible to provide a margin on a position of inserting a latch circuit. Compared with a case of uniquely determining a latch circuit insertion position, it is possible to easily achieve a logic circuit division and the optimization of divided logic circuits.

[Second Embodiment]

Figure 7:
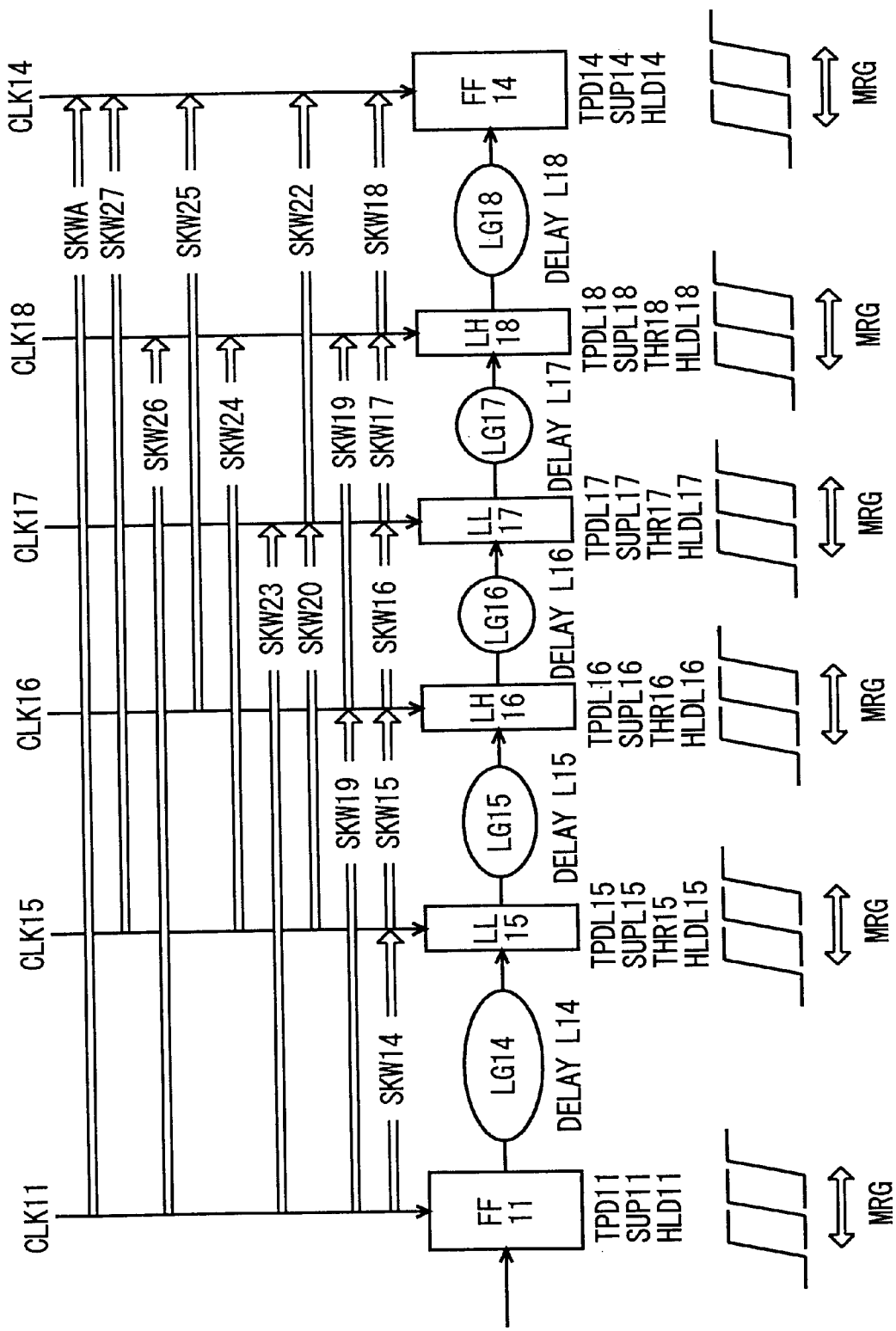
FIG. 7 is a schematic diagram showing the configuration of a three-stage pipeline according to the second embodiment of the present invention.

FIG. 7 is a schematic diagram showing the configuration of a pipeline according to the second embodiment of the present invention. The pipeline shown in FIG. 7 is equivalent to the three-stage pipeline shown in FIG. 13, with flip-flop circuit FF12 replaced by latch circuits LL15 and LH16, and with flip-flop circuit FF13 replaced by latch circuits LL17 and LH18. Latch circuits LL15 and LL17 are low active latch circuits, and latch circuits LH16 and LH18 are high active latch circuits. By dividing a flip-flop circuit into latch circuits, a logic circuit is also divided by the latch circuits.

A logic circuit LG14 is arranged between a flip-flop circuit FF11 and a low active latch circuit LL15, and a logic circuit LG15 is arranged between latch circuits LL15 and LH16. A logic circuit LG16 is arranged between latch circuits LH16 and LL17, and a logic circuit LG17 is arranged between latch circuits LL17 and LH18. A logic circuit LG18 is arranged between high active latch circuit LH18 and a flip-flop circuit FF14. Logic circuits LG14 to LG18 have logic delay time L14 to L18, respectively.

Flip-flop circuits FF11 and FF14 each take in and output received signals at the rising edge of corresponding clock signals. Therefore, a low active latch circuit LL which turns into a through state when the corresponding clock signal is at L level and a high active latch circuit which turns into a through state when the corresponding clock signal is at H level, are alternately arranged in this order.

For flip-flop circuit FF11, output delay time TPD11, setup time SUP11 and hold time HLD11 are defined.

For low active latch circuit LL15, output delay time TPDL15, setup time SUPL15 and data through time THR 15 and hold time HLDL15 are defined.

For high active latch circuit LH16, output delay time TPDL16, setup time SUPL16 and data through time THR 16 and hold time HLDL16 are defined.

For low active latch circuit LL17, output delay time TPDL17, setup time SUPL17 and data through time THR 17 and hold time HLDL17 are defined.

For high active latch circuit LH18, output delay time TPDL18, setup time SUPL18 and data through time THL 18 and hold time HLDL18 are defined.

For flip-flop circuit FF14, output delay time TPD14, setup time SUP14 and hold time HLD14 are defined.

Clock signals CLK11 and CLK14 are applied to flip-flop circuits FF11 and FF14, respectively. Clock signals CLK15, CLK16, CLK17 and CLK18 are applied to latch circuits LL15, LH16, LL17 and LH18, respectively.

A clock skew fixed factor SKW14 exists between the clock signals of latch circuit LL15 and flip-flop circuit FF11. A clock skew fixed factor SKW15 exists between the clock signals of latch circuits LL15 and LH16. A clock skew fixed factor SKW16 exists between the clock signals of latch circuits LH16 and LL17. A clock skew fixed factor SKW17 exists between the clock signals of latch circuits LL17 and LH18. A clock skew fixed factor SKW18 exists between the clock signals of latch circuit LH18 and flip-flop circuit FF14.

A clock skew fixed factor SKW19 exists between the clock signals of flip-flop circuit FF11 latch circuit LH16. A clock skew fixed factor SKW21 exists between the clock signals of latch circuits LH16 and LH18. A clock skew fixed factor SKW20 exists between the clock signals of latch circuits LL15 and LL17. A clock skew fixed factor SKW22 exists between the clock signals of latch circuit LL17 and flip-flop circuit FF14.

A clock skew fixed factor SKW23 exists between the clock signals of latch circuit LL17 and flip-flop circuit FF11. A clock skew fixed factor SKW24 exists between the clock signals of latch circuits LL15 and LH18. A clock skew fixed factor SKW25 exists between the clock signals of flip-flop circuit FF14 and latch circuit LH16.

A clock skew fixed factor SKW26 exists between the clock signals of latch circuit LH18 and flip-flop circuit FF11. A clock skew fixed factor SKW27 exists between the clock signals of flip-flop circuit FF14 and latch circuit LL15. A clock skew fixed factor SKA exists between the clock signals of flip-flop circuits FF14 and FF15.

Further, for the clock signals to flip-flop circuits FF11 and FF14 and latch circuits LL15, LH16, LL17 and LH18, clock skew uncertain factor MRG including a jitter exists.

This clock jitter uncertain factor is assumed to have no cycle period dependency and is defined as JTR+SKWET= MRG. If a clock jitter has cycle period dependency, it is taken into account as in the case of the two-stage pipeline.

Figure 13:
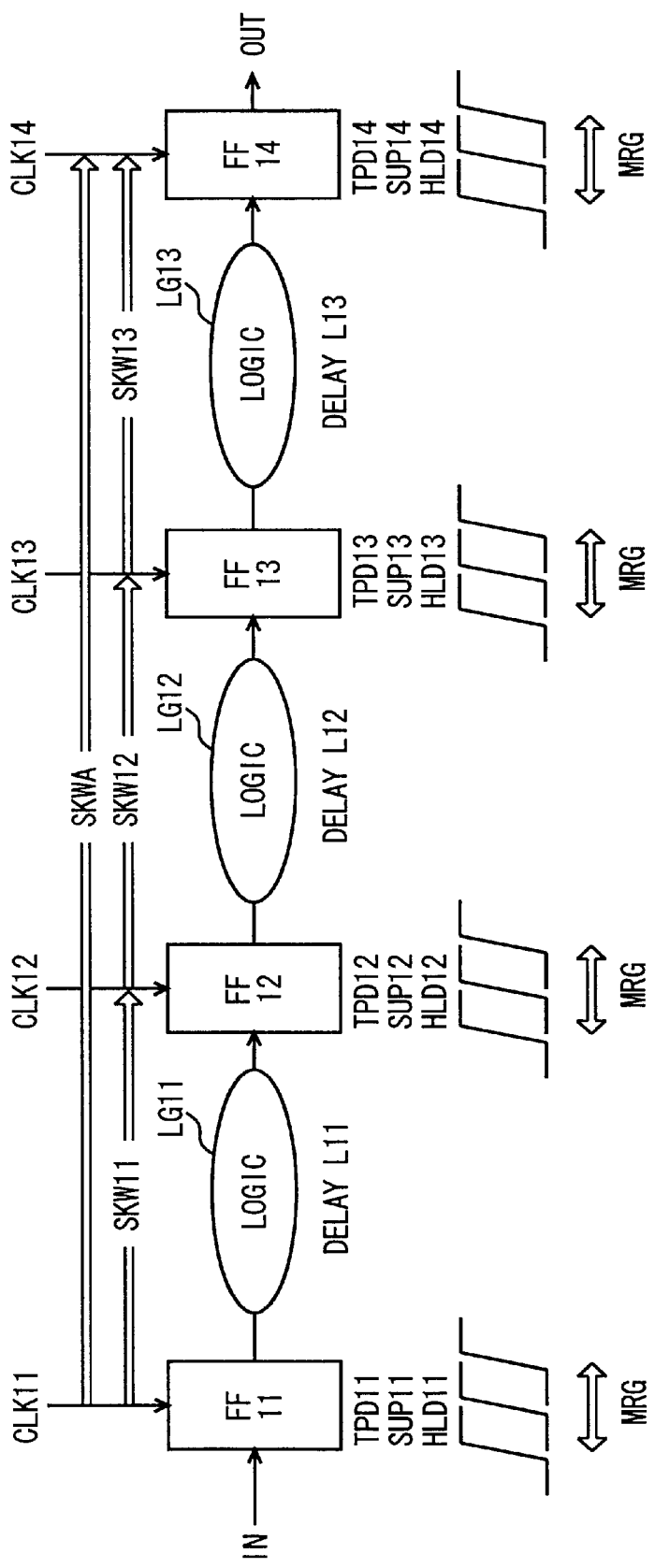
FIG. 13 is a schematic diagram showing the configuration of a three-stage pipeline according to a flip-flop design.

It is assumed that logic circuits LG15 to LG18 have logic delay time L14 to L18, respectively and that the logics of the three-stage pipeline between flip-flop circuits FF11 and FF14 are exactly the same as those of the pipeline according to the flip-flop design shown in FIG. 13, then logic delay time LL14 to LL18 are required to satisfy the following conditional expressions (41) to (51) for setup conditions and conditional expressions (56) to (60) for hold conditions:

$$L14 \leq TK-TPD11-SUPL15-SKW14-MRG \quad (41);$$

$$L15 \leq TK-TPDL15-SUPL16-SKW15-MRG \quad (42);$$

$$L16 \leq TK-TPDL16-SUPL17-SKW16-MRG \quad (43);$$

$$L17 \leq TK-TPDL17-SUPL18-SKW17-MRG \quad (44);$$

$$L18 \leq TK-TPDL18-SUP14-SKW18-MRG \quad (45);$$

$$L14+L15 \leq (1+HDY) \cdot TK-TPD11-SUPL16-SKW19-MRG1(=MRG)-THR15 \quad (46);$$

$$L15+L16 \leq (1+LDY) \cdot TK-TPDL15-SUPL17-SKW20-MRG2(=MRG)-THR16 \quad (47);$$

$$L16+L17 \leq (1+HDY) \cdot TK-TPDL16-SUPL18-SKW21-MRG1(=MRG)-THR17 \quad (48);$$

$$L17+L18 \leq (1+LDY) \cdot TK-TPDL17-SUP14-SKW22-MRG2(=MRG)-THR18 \quad (49);$$

$$L14+L15+L16 \leq 2 \cdot TK-TPD11-SUPL17-SKW23-MRG3(=MRG)-THR15-THR16 \quad (50);$$

$$L15+L16+L17 \leq 2 \cdot TK-TPDL15-SUPL18-SKW24-MRG3(=MRG)-THR16-THR17 \quad (51);$$

$$L16+L17+L18 \leq 2 \cdot TK-TPDL16-SUP14-SKW25-MRG3(=MRG)-THR17-THR18 \quad (52);$$

$$L14+L15+L16+L17 \leq (2+HDY) \cdot TK-TPD11-SUPL18-SKW26-MRG4(=MRG)-THR15-THR16-THR17 \quad (53);$$

$$L15+L16+L17+L18 \leq (2+LDY) \cdot TK-TPDL15-SUP14-SKW27-MRG5(=MRG)-THR16-THR17-THR18 \quad (54);$$

$$L14+L15+L16+L17+L18 \leq 3 \cdot TK-TPD11-SUP14-SKWA-MRG6(=MRG)-THR15-THR16-THR17-THR18 \quad (55);$$

$$LH14 \geq HLDL15-TPD11+SKWH14+SKWETH \quad (56);$$

$$LH15 \geq HLDL16-TPDL15+SKWH15+SKWETH \quad (57);$$

$$LH16 \geq HLDL17-TPDL16+SKWH16+SKWETH \quad (58);$$

$$LH17 \geq HLDL18-TPDL17+SKWH17+SKWETH \quad (59); \text{ and}$$

$$LH18 \geq HLD14-TPDL18+SKWH18+SKWETH \quad (60);$$

In the above expressions, MRG1 to MRG5 are values obtained considering the cycle period dependency of a clock jitter. If the clock jitter has no cycle period dependency, MRG1 to MRG5 are all equal to MRG.

The average delay time of the outputs of flip-flops from the clock inputs of the flip-flops, the average setup time of the flip-flops, and the average data through time of latch circuits are defined as Tpd, Sup and Thr, respectively. Then, the average permissible maximum logic delay time in this three-stage pipeline is expressed from conditional expression (55) as follows:

$$L14+L15+L16+L17+L18=3 \cdot TK-Tpd-Sup+SKWA-MRG-4 \cdot Thr \quad (61).$$

Therefore, this conditional expression (61) indicates that if a pipeline is designed using latch circuits as shown in FIG. 7, parameters Tpd, MRG and Sup need to be considered only once in the three-stage pipeline. That is, by constituting circuits using latch circuits with the penalty of the sum of data though times THR corresponding to the number of these latch circuits, it is possible to partially cancel parameters Tpd, MRG and Sup.

The right sides of conditional expressions (18) and (55) indicate the permissible maximum logic delay time over three-stage pipeline. If the difference between the right sides of conditional expressions (18) and (55) is obtained and the differential value is reduced into the gain of one pipeline stage, then it is possible to lengthen the maximum delay time by using the latch circuits by the following value MRTP3:

$$MRTP3=(\tfrac{1}{3}) \cdot (TPD12+TPD13+SUP12+SUP13+2 \cdot MRG-THR15-THR16-THR17-THR18) \quad (62).$$

If the difference between the right sides of conditional expressions (19) and (62) is obtained and the differential value is reduced into to the gain of one pipeline stage, then it is possible to lengthen the maximum delay time of the pipeline using the latch circuits by the following value:

$$MRTP3=(\tfrac{1}{3}) \cdot (2 \cdot Tpd+2 \cdot Sup+2 \cdot MRG-4 \cdot Thr) \quad (63).$$

If the condition of $2 \cdot MRG \gg 2 \cdot Tpd+2 \cdot Sup-4 \cdot Thr$ holds, it is possible to further simplify conditional expression (63) and the pipeline design using the latch circuits is advantageous by the following value:

$$MRTP3=MRG \cdot \tfrac{2}{3} \quad (64).$$

If gain MRTP3 in the pipeline design using the latch circuits is great, the logic delay time can be made longer by making use of the advantage of the latch design. Therefore, the three-stage pipeline can be manufactured in accordance with the following steps.

Step 11: Design the pipeline using flip-flop circuits with the clock cycle period being the sum of target clock cycle period TK and gain MRTP3.

Step 12: Detect a critical path on which a setup error occurs for a target clock cycle period TK.

Step 13: Divide each of two flip-flops related to an error path into a low active latch circuit and a high active latch circuit.

Step 14: Move the logic circuit of the error path to a location between the latches so as to satisfy conditional expressions (41) to (60).

FIGS. 8A to 8D are schematic diagrams illustrating the latch design procedures for the pipeline according to the second embodiment of the present invention. Referring to FIGS. 8A to 8D, the three-stage pipeline design procedures according to the second embodiment of the present invention will be described.

Figure 8A:
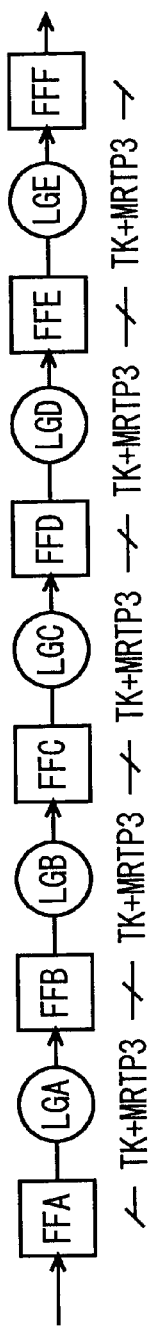
FIGS. 8A to 8D are flow chart showing a pipeline designing flow in the second embodiment of the present invention.

In FIG. 8A, as step 11, first, the setup conditions and the hold conditions employed in normally constituting a pipeline utilizing flip-flops are used. To consider a latch design, however, the pipeline is designed using a clock cycle period "TK+MRTP3" for accounting for latch gain MRTP3, rather than target clock cycle TK. For this gain MRTP3, any of conditional expressions (62) to (64) is employed. However, if a factor indicating the cycle period dependency of a clock jitter is considered, the expression for gain MRTP3 becomes a complicated equation, as in constituting the two-stage pipeline. In FIG. 8A, logic circuits LGA to LGE are arranged in respective subsequent stages of flip-flop circuits FFA to FFE. The output of logic circuit LGE in the final stage is applied to a flip-flop circuit FFF.

Figure 8B:
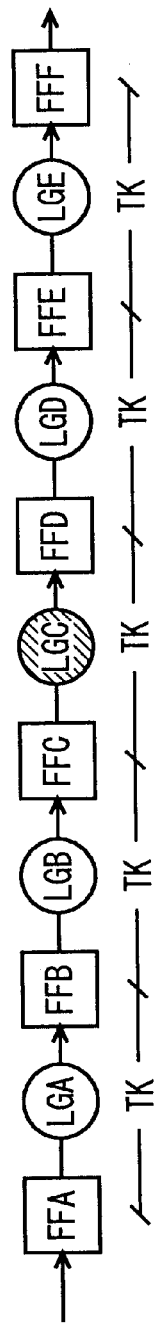

Next, as shown in FIG. 8B, in step 12, the cycle of the clock signal is set at target cycle period TK and a critical path on which a setup error occurs is detected as in the case of the first embodiment. In order to detect this error path, as in the case of the first embodiment, various means such as a calculation on a logic synthesis tool and a calculation in back annotation can be employed. In FIG. 8B, a state in which logic circuit LGC becomes an error path is shown by way of example.

Figure 8C:
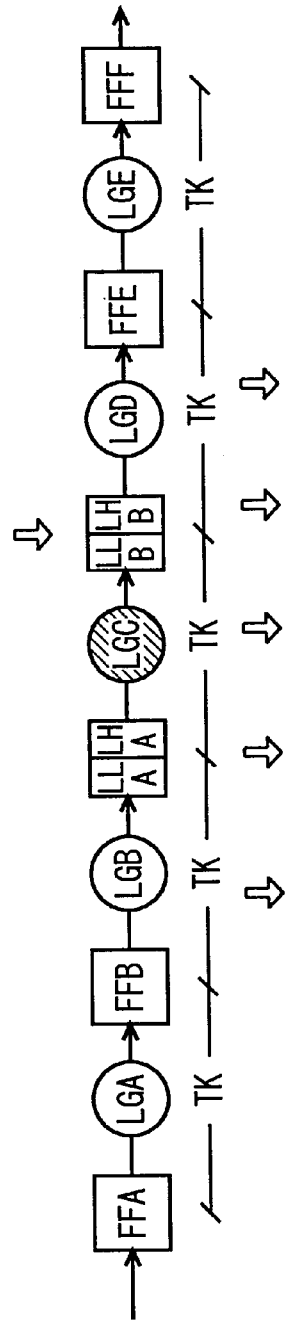

Next, as shown in FIG. 8C, in step S13, two flip-flop circuits related to this critical path are selected. In selecting the two flip-flop circuits, following three cases can be considered. Namely, first, the two flip-flop circuits (FFB and FFC) at the preceding stage of the error path are selected. Secondly, the flip-flop circuit (FFC) on an error path starting point side and the flip-flop circuit (FFD) at the subsequent stage of the error path are selected. Thirdly, the flip-flop circuit (FFD) at the subsequent stage of the error path and the flip-flop circuit (FFB) in the further subsequent stage are selected.

If each of the flip-flop circuit under any conditions out of the above conditions can be divided into latch circuits, the two flip-flop circuits to be divided are determined according to conditions such as a delay time at the preceding stage and the delay of the subsequent stage. If the selected flip-flop circuits are rising edge type flip-flop circuits, each flip-flop circuit is divided such that a low active latch circuit is arranged at the preceding stage and a high active latch circuit is arranged at the subsequent stage. Conversely, if the selected flip-flop circuits are falling edge type flip-flop circuits, each flip-flop circuit is divided such that a high active latch circuit is arranged at the preceding stage and a low active latch circuit is arranged at the subsequent stage. In FIG. 8C, flip-flop circuits FFC and FFD at preceding and subsequent stages of this error path, respectively, are selected. Flip-flop circuit FFC is divided into a low active latch circuit LLA and a high active latch circuit LHA. Flip-flop circuit FFD is divided into a low active latch circuit LLB and a high active latch circuit LHB.

Figure 8D:
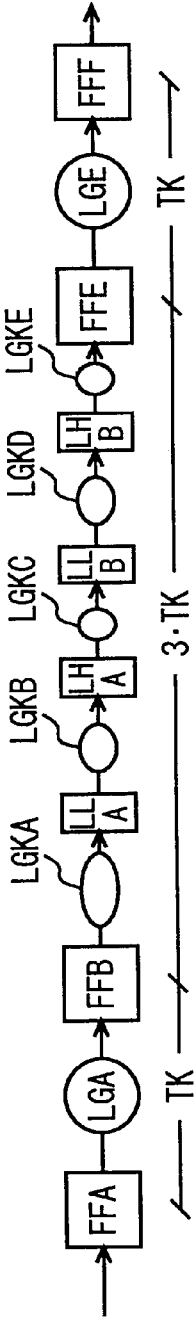

Next, referring to FIG. 8D, in step 14, the logic circuits (LGB to LGD) in the three-stage pipeline are divided into five logic circuit sections in accordance with the latch design conditional expressions, i.e., conditional expressions (56) to (60) for the hold conditions and conditional expressions (41) to (55) for the setup conditions. In FIG. 8D, logic circuits LGB to LGD are divided into logic circuits LGKA to LGKE. Specifically, logic circuit LGKA is arranged between flip-flop circuit FFB and low active latch circuit LLA, logic circuit LGKB is arranged between latch circuits LLA and LHA, and logic circuit LGKC is arranged between latch circuits LHA and LLB. Logic circuit LGKD is arranged between latch circuits LLB and LHB. Logic circuit LGKE is arranged between latch circuit LHB and flip-flop circuit FFE. Flip-flop circuit FFB to flip-flop circuit FFE correspond to three pipeline stages and have a clock cycle period of 3·TK.

Accordingly, by using steps 11 to 14 in the flow for the latch design, it is possible to increase the logic delay time which can be inserted into one pipeline stage. The increase of the allowable logic delay time can reduce a design time period due to the improvement of delay convergence time. In addition, it is possible to incorporate a more complex logic circuit between the pipeline stages. Besides, since the number of paths sufficient in delay time increases, it is possible to reduce a circuit area by logic improvement as in the case of the first embodiment.

In addition, as in the case of the first embodiment, since inequalities are used as the conditional expressions for the logic delay time, it is possible to provide an allowance on—a position of arranging a latch circuit. It is possible to easily rearrange logic circuits by dividing flip-flop circuits and to optimize logic circuits after the division.

[General Configuration]

The latch designs in the two-stage pipeline and the three-stage pipeline have been described above. It is also possible to similarly consider the configuration of a pipeline having four or more stages and the mixture of the two-stage pipeline configuration and the three-stage pipeline configuration. It is noted, however, that if the number of pipeline stages increases, the delay gain of the latch design relative to that of the design using flip-flop circuits increases but the scale of the conditional expressions become greater and the design becomes complicated. Normally, if an N-stage pipeline is designed using latch circuits, a gain MRTPN per one pipeline stage is expressed as follows:

$$MRTPN=(1/N)\cdot\{(N-1)Tpd+(N-1)Sup+(N-1)\cdot MRG-2\cdot(N-1)\cdot Thr\}.$$

In addition, as an example of the ambiguity factors of the clock signal, clock skews and clock jitters have been described. However, by considering the other design factors and conditions, the same advantages can be obtained if these clock signal ambiguities can be expressed by the conditional expressions given so far or similar expressions.

Further, even if falling edge type flip-flop circuits for outputting signals/data synchronously with the fall of clock signals are employed as flip-flop circuits in place of the rising edge type flip-flop circuits for outputting signals/data at the rising edge of clock signals, the same advantages can be provided.

Furthermore, in the inequalities for the hold conditions, the logic delay time is denoted by the different reference symbol from that of the logic delay time for the setup conditions. However, as described in the first embodiment, the logic delay time of each logic circuit in an actually designed pipeline satisfies both the setup and hold conditions.

As stated so far, according to the present invention, the clock cycle period is set longer by a predetermined value and the logic circuits are arranged, and the flip-flop circuits related to an error path on which an error for the target clock cycle occurs are replaced by latch circuits to rearrange the logic circuits in the pipeline design using flip-flop circuits. It is, therefore, possible to increase the permissible maximum logic delay time of a logic path in a pipeline and to easily design a pipeline.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of designing a semiconductor integrated circuit device comprising a pipeline including a plurality of flip-flop circuits each transferring a signal synchronously with a basic clock signal, comprising the steps of:

designing said pipeline using the flip-flop circuits with a cycle period of a transfer clock signal being a sum of a cycle of said basic clock signal and a gain time obtained when a specific flip-flop circuit in said pipeline is replaced by a latch circuit;

setting the cycle period of said transfer clock signal at the cycle period of said basic clock signal and detecting an error path in the designed pipeline;

dividing a flip-flop circuit related to said error path into a plurality of latch circuits complementarily operating synchronously with said transfer clock signal; and dividing a logic circuit related to said error path by said plurality of latch circuits such that a predetermined conditional inequality for signal propagation delay is satisfied for logic circuit stages related to the respective latch circuits, thereby rearranging the logic circuit.

2. The method of designing a semiconductor integrated circuit device according to claim 1, wherein
the step of detecting said error path includes a step of detecting a path causing a setup error that a setup condition for said transfer clock signal is violated, as said error path.

3. The method of designing a semiconductor integrated circuit device according to claim 1, wherein
the step of dividing the flip-flop circuit related to said error path into said plurality of latch circuits includes a step of dividing one flip-flop circuit related to said error path into two complementarily operating latch circuits.

4. The method of designing a semiconductor integrated circuit device according to claim 1, wherein
the step of dividing the flip-flop circuit related to said error path into said plurality of latch circuits includes a step of dividing each of the flip-flop circuits related to said error path into two complementarily operating latch circuits.

5. The method of designing a semiconductor integrated circuit device according to claim 1, wherein
said gain time is provided by a difference (a−b) between (a) a sum of a signal output delay time of a target flip-flop circuit of interest relative to said transfer clock signal, a setup time of said target flip-flop circuit and a margin for said transfer clock signal, and (b) signal propagation delay times of said plurality of latch circuits, divided by a number of pipeline stages associated with said target flip-flop circuit.

6. The method of designing a semiconductor integrated circuit device according to claim 1, wherein
said predetermined conditional inequality is derived considering at least a skew of said basic clock signal for each of said plurality of latch circuits, a margin for said basic clock signal, a signal propagation delay time of each of the flip-flop circuit at a preceding stage of the latch circuits and said plurality of latch circuits, a setup time of the flip-flop circuit at a subsequent stage of the latch circuits, a setup time of each of said plurality of latch circuits, the cycle period of said basic clock signal, and a duty of the basic clock signal for a latching period of each of said latch circuits.

7. The method of designing a semiconductor integrated circuit device according to claim 6, wherein
said predetermined conditional inequality further includes an inequality derived considering hold conditions of said plurality of latch circuits and said flip-flop circuit at the subsequent stage for said basic clock signal, an output delay time of each of said latch circuits relative to the basic clock signal and the flip-flop circuit at the preceding stage relative to said basic clock signal, and a margin for said basic clock signal.

8. A semiconductor integrated circuit device comprising:
a first flip-flop circuit for transferring a received signal synchronously with a clock signal;
a first latch circuit operating complementarily to said first flip-flop circuit and synchronously with said clock signal, for transferring and latching a signal applied thereto;
a first logic circuit arranged between said first flip-flop circuit and said first latch circuit, performing a logic processing on a signal applied from at least said first flip-flop circuit, and transferring a resultant signal to said first latch circuit;
a second latch circuit operating complementarily to said first latch circuit and synchronously with said clock signal, and transferring and latching a signal applied thereto;
a second logic circuit arranged between said first latch circuit and said second latch circuit, performing a logic processing on a signal from said first latch circuit, and transferring a resultant signal to said second latch circuit;
a second flip-flop circuit operating complementarily to said second latch circuit and synchronously with said clock signal, for transferring a signal applied thereto; and
a third logic circuit arranged between said second latch circuit and said second flip-flop circuit, performing a logic processing on a signal received from said second latch circuit, and transferring a resultant signal to said second flip-flop circuit,
said first and second latch circuits and said first and second flip-flop circuits being arranged so as to satisfy the following conditions:

$$L1 \leq TK-TPDF1-SUPL1+SKW1-SKET-JTR \quad (1);$$

$$L2 \leq TK-TPDL1-SUPL2+SKW2-SKET-JTR \quad (2);$$

$$L3 \leq TK-TPDL2-SUPF2+SKW3-SKET-JTR \quad (3);$$

$$L1+L2 \leq (1+HDY)\cdot TK-TPDF1-SUPL2+SKW4-SKET-JTR\cdot K1-THR1 \quad (4);$$

$$L2+L3 \leq (1+LDY)\cdot TK-TPDL1-SUPF2+SKW5-SKET-JTR\cdot K2-THR2 \quad (5);$$

$$L1+L2+L3 \leq 2\cdot TK-TPDF1-SUPF2+SKWA-SKET-JTR\cdot K3-THR1-THR2 \quad (6);$$

$$L1 \geq HLDL1-TPDFH1+SKWH1+SKETH \quad (7);$$

$$L2 \geq HLDL2-TPDLH1+SKWH2+SKETH \quad (8); \text{ and}$$

$$L3 \geq HLDF2-TPDLH2+SKWH3+SKETH \quad (9),$$

in which, L1, L2 and L3 indicate logic delay time of the first, second and third logic circuits, respectively; TK indicates the cycle period of said clock signal; TPDF1 indicates a delay of a signal output of said first flip-flop circuit from said clock signal; TPDL1 and TPDL2 indicate delays of output signals of the first and second latch circuits relative to said clock signal, respectively; SKW1, SKW2 and SKW3 indicate skews of said clock signal for a clock signal applied to the circuit at a preceding stage; SKW4 indicates a skew of the clock signal applied to said second latch circuit for the clock signal applied to said first flip-flop circuit; SKW5 indicates the skew of the clock signal applied to said first latch circuit for the clock signal applied to said second flip-flop circuit; SKWA indicates the skew of the clock signal applied to said second flip-flop circuit for the clock signal applied to said first flip-flop circuit; SUPL1, SUPL2 and SUPF2 indicate setup time of said first latch circuit, setup time of said second latch circuit, and setup time of said second flip-flop circuit, respectively; SKET indicates a fixed skew due to an uncertain factor of said clock signal; JTR indicates a jitter of said clock signal for the clock signal of a circuit at a preceding stage; THR1 and THR2 indicate signal propagation delay time of said first latch circuit and signal propagation delay time of said second latch circuit, respectively; HDY and LDY indicate duties of the clock signal for the first and second latch circuits in a latching period, respectively; K1, K2 and K3 indicate coefficients indicating a cycle period dependency of said jitter; HLDL1 and HLDL2 and HLDF2 indicate hold time of said first latch circuit, said second latch circuit and said second flip-flop circuit for said clock signal, respectively; TPDFH1, TPDLH1 and TPDLH2 indicate delays of output signals of said first flip-flop circuit, said first latch circuit and said second latch circuit relative to input of said clock signal with respect to hold conditions, respectively; SKWH1, SKWH2 and SKWH3 indicate skews of said clock signal for a clock signal applied to the circuit at the preceding stage with respect to the hold conditions; and SKETH indicates a fixed skew caused by the uncertain factor of said clock signal.

9. The semiconductor integrated circuit according to claim 8, wherein said conditional expressions (1) to (6) are modified into following conditional expressions, respectively, with the cycle period dependency of the jitter JTR of said clock signal neglected:

$$L1 \leq TK - TPDF1 - SUPL1 + SKW1 - MRG \quad (10);$$

$$L2 \leq TK - TPDL1 - SUPL2 + SKW2 - MRG \quad (11);$$

$$L3 \leq TK - TPDL2 - SUPF2 + SKW3 - MRG \quad (12);$$

$$L1 + L2 \leq (1 + HDY) \cdot TK - TPDF1 - SUPL2 + SKW4 - MRG - THR1 \quad (13);$$

$$L2 + L3 \leq (1 + LDY) \cdot TK - TPDL1 - SUPF2 + SKW5 - MRG - THR2 \quad (14); \text{ and}$$

$$L1 + L2 + L3 \leq 2 \cdot TK - TPDF1 - SUPF2 + SKWA - MRG - THR1 - THR2 \quad (15),$$

in which MRG is given by SKET+JTR.

10. A semiconductor integrated circuit device comprising:

a first flip-flop circuit for transferring an applied signal synchronously with a clock signal;

a first logic circuit performing a logic processing on the signal received from said first flip-flop circuit;

a first latch circuit operating complementarily to said first flip-flop circuit and synchronously with said clock signal, and transferring and latching an output signal of said first logic circuit;

a second logic circuit performing a logic processing on the signal received from said first latch circuit;

a second latch circuit operating complementarily to said first latch circuit and synchronously with said clock signal, and transferring and latching an output signal of said second logic circuit;

a third logic circuit performing a logic processing on an output signal of said second latch circuit, and outputting a resultant signal;

a third latch circuit operating complementarily to said second latch circuit and synchronously with said clock signal, and transferring and latching the output signal of said third logic circuit;

a fourth logic circuit performing a logic processing on the signal received from said third latch circuit, and outputting a resultant signal;

a fourth latch circuit operating complementarily to said third latch circuit and synchronously with said clock signal, and transferring and latching the resultant signal of said fourth logic circuit;

a fifth logic circuit performing a logic processing on an output signal of said fourth latch circuit, and outputting a resultant signal; and a second flip-flop circuit operating, in a common phase with said fourth latch circuit, synchronously with said clock signal, and transferring the output resultant signal of said fifth logic circuit, logic delay time L1 to L5 of the first to fifth logic circuits satisfying following conditions:

$$L1 \leq TK - TPDF1 - SUPL1 + SKW1 - MRG \quad (1);$$

$$L2 \leq TK - TPDL1 - SUPL2 + SKW2 - MRG \quad (2);$$

$$L3 \leq TK - TPDL2 - SUPL3 + SKW3 - MRG \quad (3);$$

$$L4 \leq TK - TPDL3 - SUPL4 + SKW4 - MRG \quad (4);$$

$$L5 \leq TK - TPDL4 - SUPF2 + SKW5 - MRG \quad (5);$$

$$L1 + L2 \leq (1 + HDY) \cdot TK - TPDF1 - SUPL2 - SKW21 - MRGJ1 - THR1 \quad (6);$$

$$L2 + L3 \leq (1 + LDY) \cdot TK - TPDL1 - SUPL3 - SKW22 - MRGJ2 - THR2 \quad (7);$$

$$L3 + L4 \leq (1 + HDY) \cdot TK - TPDL2 - SUPL4 - SKW23 - MRGJ1 - THR3 \quad (8);$$

$$L4 + L5 \leq (1 + LDY) \cdot TK - TPDL3 - SUPF2 - SKW24 - MRGJ2 - THR4 \quad (9);$$

$$L1 + L2 + L3 \leq 2 \cdot TK - TPDF1 - SUPL3 - SKW31 - MRGJ3 - THR1 - THR2 \quad (10);$$

$$L2 + L3 + L4 \leq 2 \cdot TK - TPDL1 - SUPL4 - SKW32 - MRGJ3 - THR2 - THR3 \quad (11);$$

$$L3 + L4 + L5 \leq 2 \cdot TK - TPDL2 - SUPF2 - SKW33 - MRGJ3 - THR3 - THR4 \quad (12);$$

$$L1 + L2 + L3 + L4 \leq (2 + HDY) \cdot TK - TPDF1 - SUPL4 - SKW41 - MRGJ4 - THR1 - THR2 - THR3 \quad (13);$$

$$L2 + L3 + L4 + L5 \leq (2 + LDY) \cdot TK - TPDL1 - SUPF2 - SKW42 - MRGJ5 - THR2 - THR3 - THR4 \quad (14);$$

$$L1 + L2 + L3 + L4 + L5 \leq 3 \cdot TK - TPDF1 - SUPF2 - SKW51 - MRGJ - THR1 - THR2 - THR3 - THR4 \quad (15);$$

$$L1 \geq HLDL1 - TPDFH1 + SKWH1 + MRGH \quad (16);$$

$$L2 \geq HLDL2 - TPDLH1 + SKWH2 + MRGH \quad (17);$$

$$L3 \geq HLDL3 - TPDLH2 + SKWH3 + MRGH \quad (18);$$

$$L4 \geq HLDL4 - TPDLH3 + SKWH4 + MRGH \quad (19); \text{ and}$$

$$L5 \geq HLDF2 - TPDLH4 + SKWH5 + MRGH \quad (20),$$

in which, TK indicates a cycle period of said basic clock signal; TPDF1 indicates delay time of the output signal of said first flip-flop circuit relative to input of said clock signal; TPDL1 to TPDL4 each indicate delays of output signals of the first to fourth latch circuits relative to a corresponding trigger edge of said clock signal; SUPL1 to SUPL4 indicate setup time of the first to fourth latch circuits with respect to said clock signal; SUPF2 indicates a setup time of said second flip-flop circuit with respect to said clock signal; SKW1 to SKW5 indicate skews of said clock signal for a clock signal applied to a circuit at a preceding stage; SKW21 to SKW24 indicate skews of clock signals for consecutive two stages of logic circuits of the first to fifth logic circuits; SKW31 to SKW33 indicate skews of clock signals for consecutive three stages of logic circuits of the first to fifth logic circuits; SKW41 and SKW42 indicate skews of clock signals for consecutive four stages of logic circuits of the first to fifth logic circuits; SKW51 indicates a skew of a clock signal applied to said second flip-flop circuit with respect to a clock signal applied to said first flip-flop circuit; THR1 to THR4 indicate signal propagation delay time of the first to fourth latch circuits; HDY indicates a duty of said clock signal for a latching state of each of the first and third latch circuits; LDY indicates a duty of said clock signal for a latching state of each of the second and fourth latch circuits; MRG indicates a margin for a component including jitter of said clock signal; MRGJ1 to MRGJ5 indicate margins for said clock signal with cycle period dependency of said jitter taken into account; HLDL1 to HLDL4 indicate hold time of the first to fourth latch circuits for said clock signal; HLDF2 indicates a hold time of said second flip-flop circuit for said clock signal; TPDF1 indicates a delay of the output signal of said first flip-flop circuit relative to a trigger edge of said clock signal with respect to hold conditions; TPDLH1 to TPDLH4 indicate delays of output signals of the first to fourth latch circuits relative to a corresponding trigger edge of said clock signal; SKWH1 to SKWH5 indicate skews of said clock signal for a clock signal applied to the circuit at the preceding stage with respect to the hold conditions; and MRGH indicates the margin for said clock signal with respect to the hold conditions.

11. The semiconductor integrated circuit device according to claim 10, wherein the MRGJ1 to MRGJ5 are the same in value with said MRG under conditions that the cycle period dependency of said jitter of said clock signal is negligible.

* * * * *